(12) United States Patent
Taoka et al.

(10) Patent No.: US 8,458,627 B2
(45) Date of Patent: Jun. 4, 2013

(54) SEMICONDUCTOR DEVICE INCLUDING LOGIC CIRCUIT HAVING AREAS OF DIFFERENT OPTICAL PROXIMITY ACCURACY

(75) Inventors: Hironobu Taoka, Tokyo (JP); Yusaku Ono, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/333,577

(22) Filed: Dec. 21, 2011

(65) Prior Publication Data

US 2012/0091510 A1 Apr. 19, 2012

Related U.S. Application Data

(62) Division of application No. 11/919,228, filed as application No. PCT/JP2006/308620 on Apr. 25, 2006, now Pat. No. 8,103,977.

(30) Foreign Application Priority Data

Apr. 26, 2005 (JP) ................. 2005-127798

(51) Int. Cl.
*G06F 17/50* (2006.01)
*H01L 27/118* (2006.01)
*H01L 25/00* (2006.01)
*H03K 19/173* (2006.01)

(52) U.S. Cl.
USPC .................. 716/55; 716/50; 716/51; 716/53; 257/202; 326/37; 326/47

(58) Field of Classification Search
USPC .......... 257/202; 716/50–51, 53, 55, 118–119, 716/122; 326/37, 47
See application file for complete search history.

(56) References Cited

U.S. PATENT DOCUMENTS

| 6,020,616 A * | 2/2000 | Bothra et al. ................. 257/381 |
| 6,909,189 B2 * | 6/2005 | Nanjo ........................... 257/758 |

(Continued)

FOREIGN PATENT DOCUMENTS

| CN | 1551233 A | 12/2004 |
| JP | 09-319067 | 12/1997 |

(Continued)

OTHER PUBLICATIONS

Chinese Office Action, w/ English translation thereof, issued in Chinese Patent Application No. CN 200680014103.7 dated Nov. 1, 2010.

(Continued)

*Primary Examiner* — Stacy Whitmore
(74) *Attorney, Agent, or Firm* — McDermott Will & Emery LLP

(57) ABSTRACT

An object of the present invention is to reduce processing time and manufacturing cost for a semiconductor device including a logic circuit. To accomplish the above object, an area (114) for forming a logic circuit includes a first area (114*b*, 170) which is subjected to optical proximity correction with predetermined accuracy, and a second area (114*a*, 180) which is subjected to optical proximity correction with accuracy lower than said predetermined accuracy. Especially, the first area (114*b*, 170) includes a gate interconnection line (172) which acts as a transistor, and the second area (114*a*, 180) includes a dummy layout pattern (182) which does not act as a transistor.

23 Claims, 32 Drawing Sheets

U.S. PATENT DOCUMENTS

| | | | |
|---|---|---|---|
| 7,026,078 B2 * | 4/2006 | Kawashima et al. | 430/5 |
| 7,175,940 B2 | 2/2007 | Laidig et al. | |
| 7,260,812 B2 | 8/2007 | Melvin et al. | |
| 7,353,145 B2 | 4/2008 | Tanaka et al. | |
| 7,469,396 B2 * | 12/2008 | Hayashi et al. | 716/119 |
| 7,480,890 B2 | 1/2009 | Hsiao | |
| 7,694,267 B1 | 4/2010 | Ye et al. | |
| 7,707,542 B1 | 4/2010 | Gennari et al. | |
| 2003/0061958 A1 * | 4/2003 | Zhang | 101/463.1 |
| 2003/0140330 A1 | 7/2003 | Tanaka et al. | |
| 2003/0149955 A1 | 8/2003 | Ohnuma | |
| 2004/0014272 A1 * | 1/2004 | Shibutani | 438/206 |
| 2004/0089950 A1 * | 5/2004 | Nanjo | 257/758 |
| 2004/0174735 A1 | 9/2004 | Agata | |
| 2004/0250232 A1 | 12/2004 | Kobozeva et al. | |
| 2005/0044522 A1 | 2/2005 | Maeda | |
| 2005/0086618 A1 | 4/2005 | Ito et al. | |
| 2005/0149902 A1 | 7/2005 | Shi et al. | |
| 2005/0204322 A1 * | 9/2005 | Kotani et al. | 716/10 |
| 2006/0039597 A1 | 2/2006 | Kotani et al. | |
| 2007/0061772 A1 | 3/2007 | Ye et al. | |
| 2007/0061773 A1 | 3/2007 | Ye et al. | |
| 2008/0216027 A1 | 9/2008 | White et al. | |
| 2009/0019419 A1 | 1/2009 | Misaka et al. | |
| 2009/0031261 A1 | 1/2009 | Smith et al. | |
| 2010/0031224 A1 | 2/2010 | Ogawa et al. | |
| 2010/0153904 A1 | 6/2010 | Zhang | |

FOREIGN PATENT DOCUMENTS

| | | | |
|---|---|---|---|
| JP | 10-199785 | | 7/1998 |
| JP | 10-301255 | | 11/1998 |
| JP | 2000-162758 | | 6/2000 |
| JP | 2001-100390 | | 4/2001 |
| JP | 2002-328457 | | 11/2002 |
| JP | 2002-341514 | | 11/2002 |
| JP | 2003-173012 | | 6/2003 |
| JP | 2004-302263 | A | 10/2004 |
| JP | 2004-354919 | A | 12/2004 |
| JP | 2004354919 | A * | 12/2004 |
| JP | 2005-072133 | | 3/2005 |

OTHER PUBLICATIONS

Japanese Office Action, with English translation, issued in Japanese Patent Application No. 2007-514733, mailed Apr. 5, 2011.

Chinese Office Action, w/ partial English translation thereof, issued in Chinese Patent Application No. CN 200680014103.7 dated May 11, 2010.

Chinese Office Action with English translation and Japanese translation issued in application No. 200680014103.7 issued on Apr. 19, 2012.

Japanese Office Action with partial English translation issued in Japanese Application No. 2007-514733 issued on Mar. 1, 2012.

* cited by examiner

FIG. 1
(a)
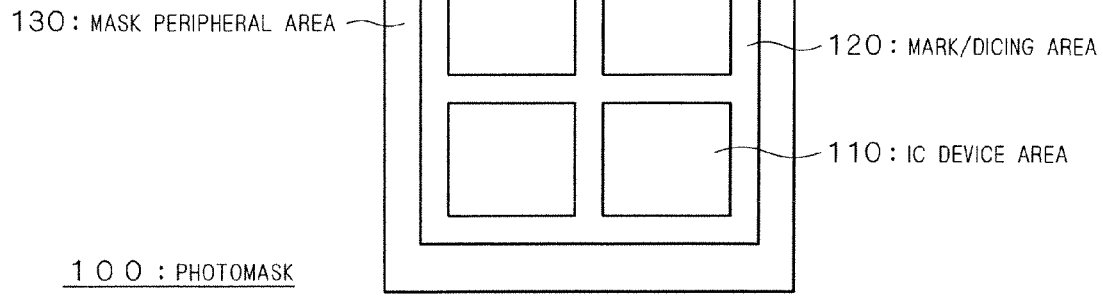
130: MASK PERIPHERAL AREA
120: MARK/DICING AREA
110: IC DEVICE AREA
100: PHOTOMASK
(b)
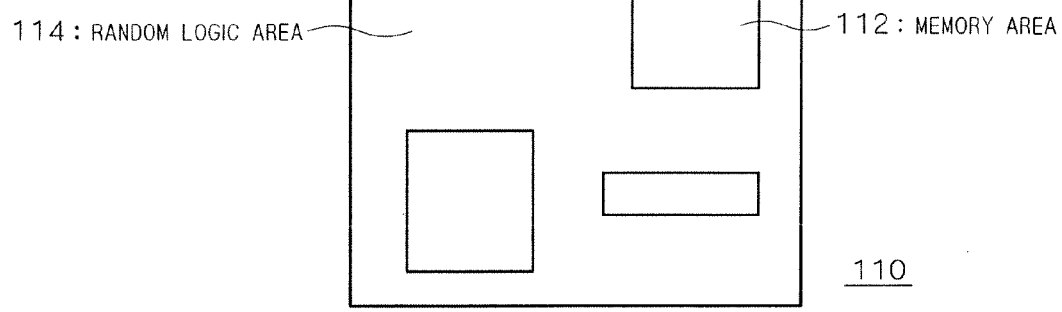
114: RANDOM LOGIC AREA
112: MEMORY AREA
110
(c)
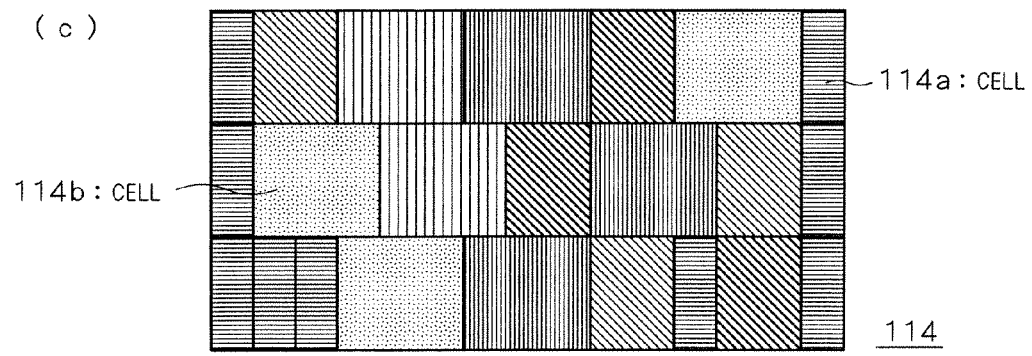
114a: CELL
114b: CELL
114
(d)
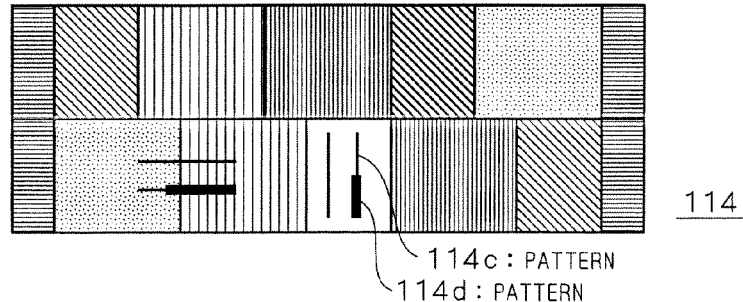
114c: PATTERN
114d: PATTERN
114

FIG. 4
(a)
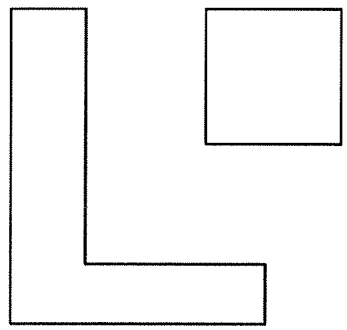
(b)
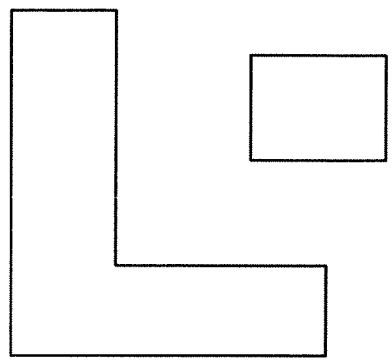
(c)
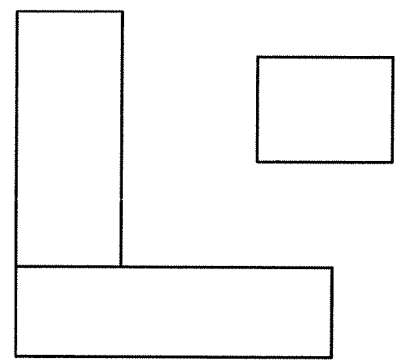
(d)
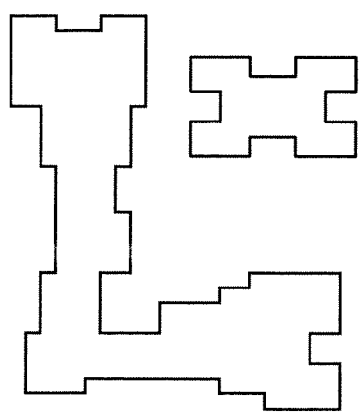
(e)
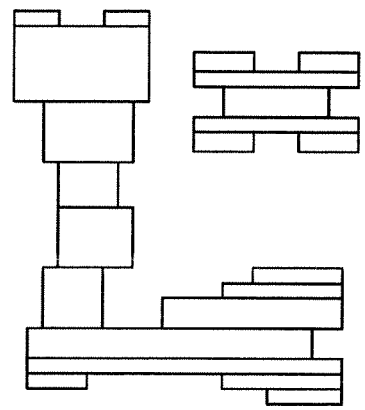

FIG. 5
(a)
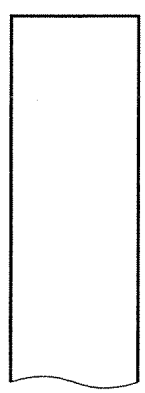
(b)
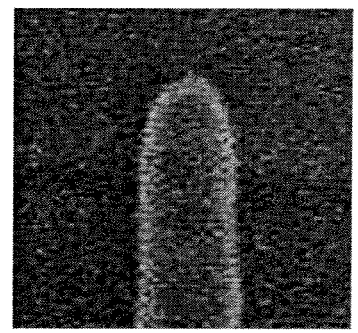
(c)
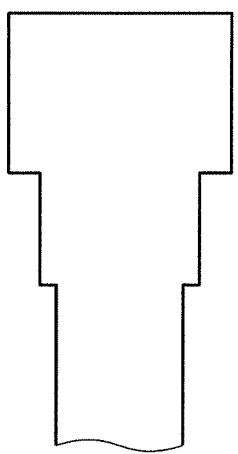
(d)
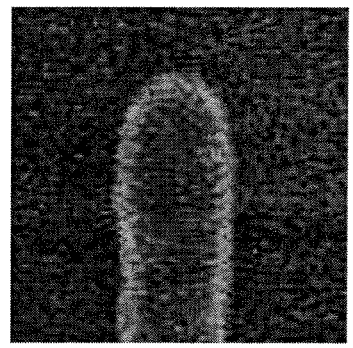

FIG. 6
(a)
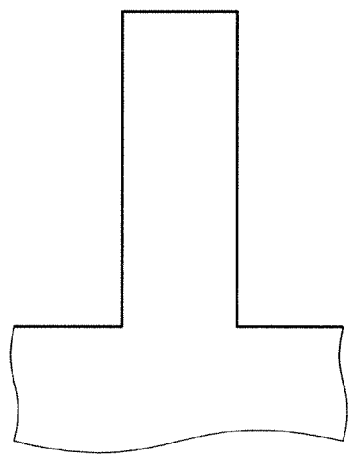
(b)
(c)
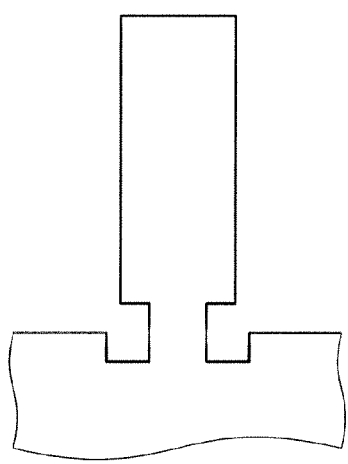
(d)
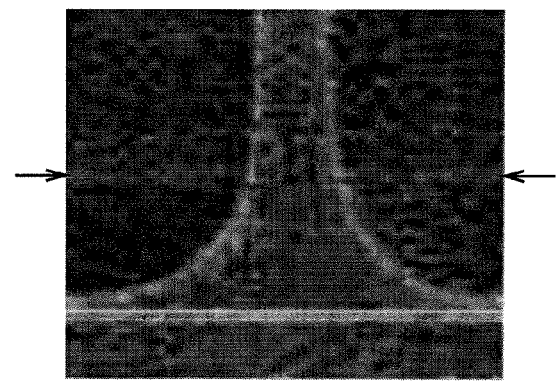

FIG. 8
(a)
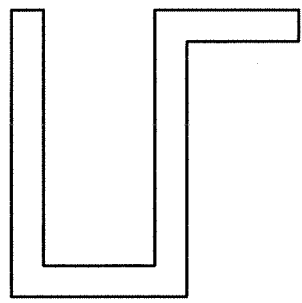
(b)
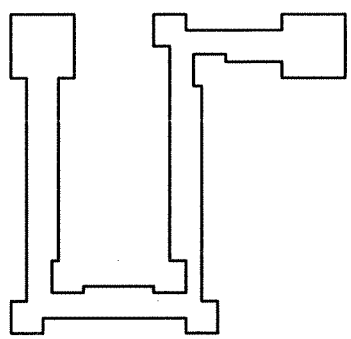
(c)
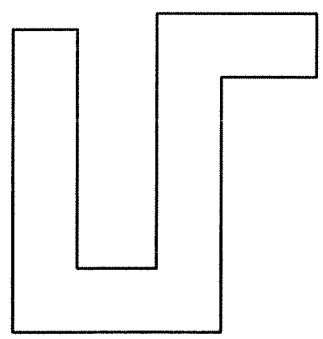
(d)
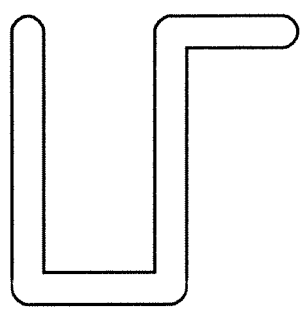
(e)
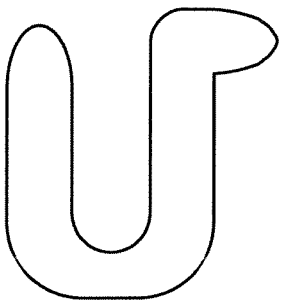

FIG. 10
(a)
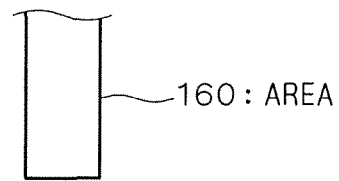
160: AREA
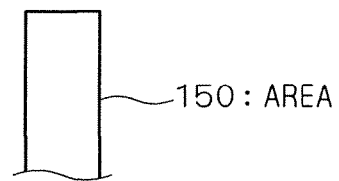
150: AREA
(b)
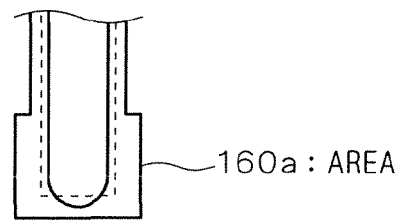
160a: AREA
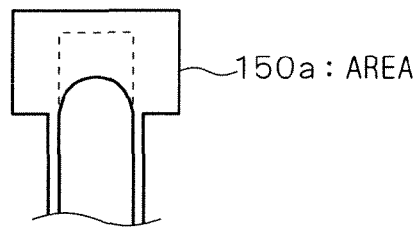
150a: AREA
(c)
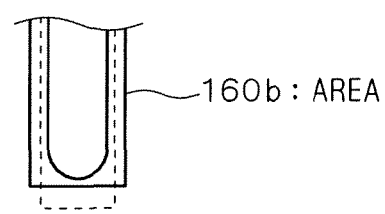
160b: AREA
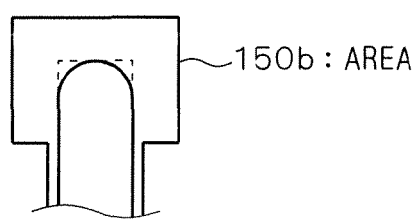
150b: AREA F I G . 1 2
(a)
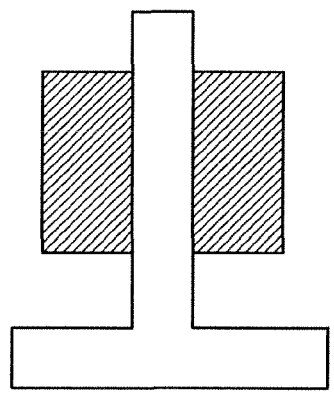
(b)
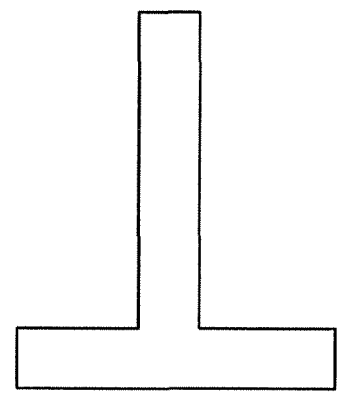
(c)
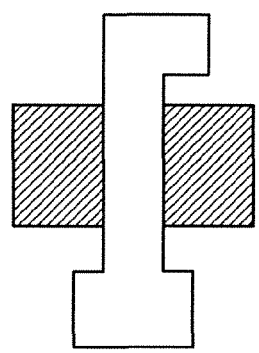
(d)
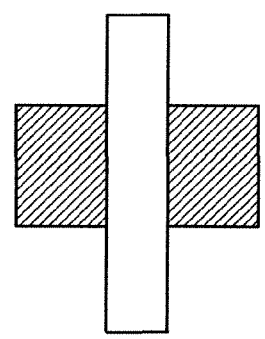
(e)
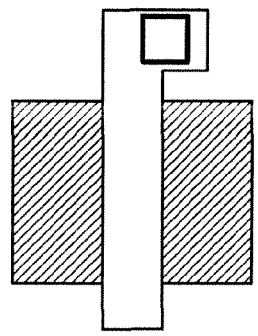
(f)
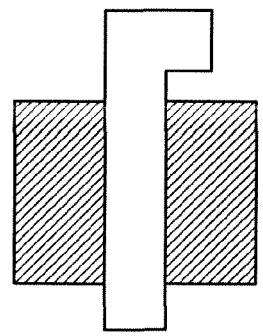

FIG. 14
(a)
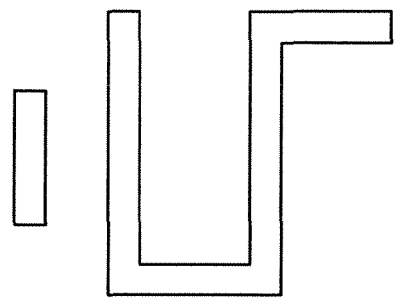
(b)
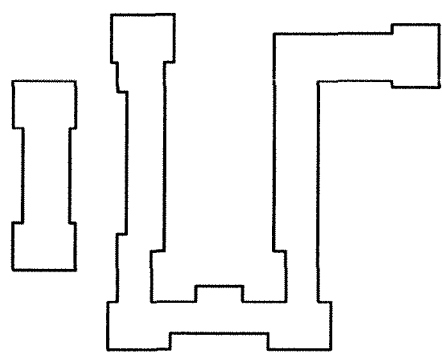
(c)
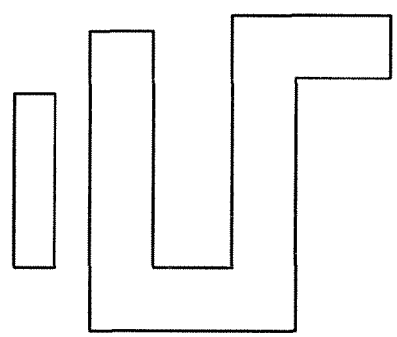
(d)
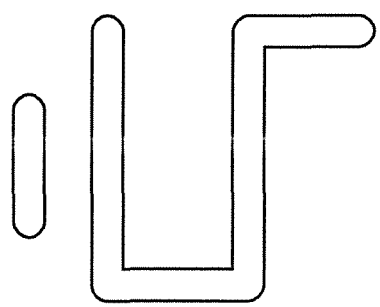
(e)
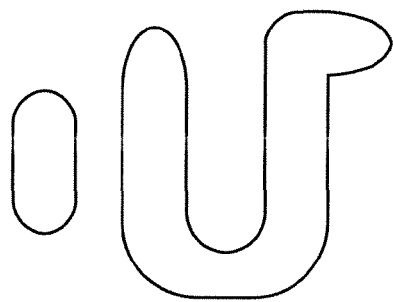

FIG. 15
(a)
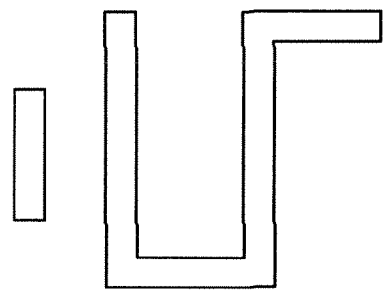
(b)
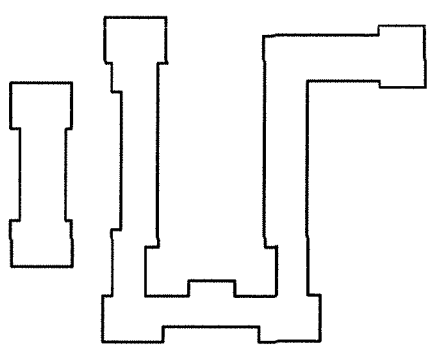
(c)
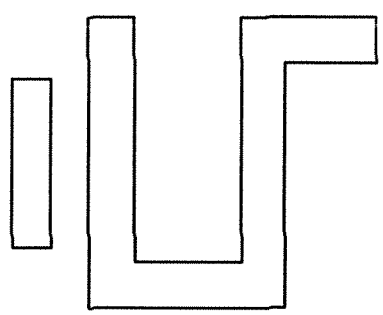
(d)
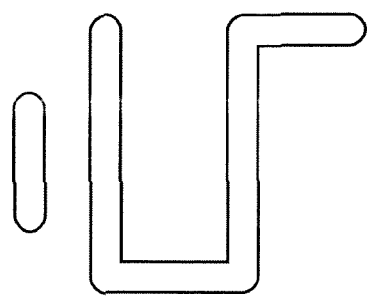
(e)
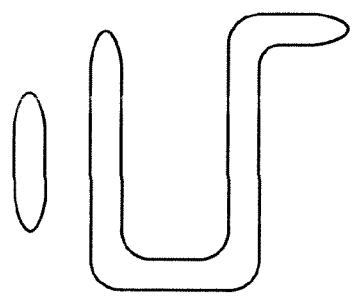

FIG. 16
(a)
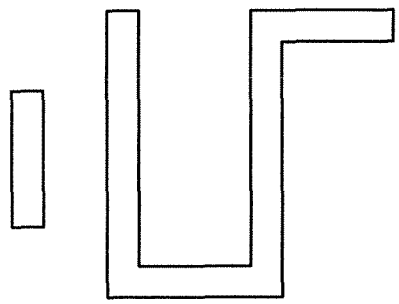
(b)
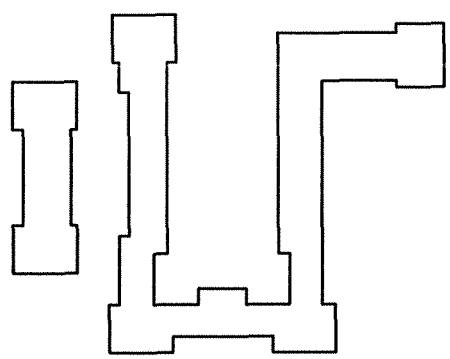
(c)
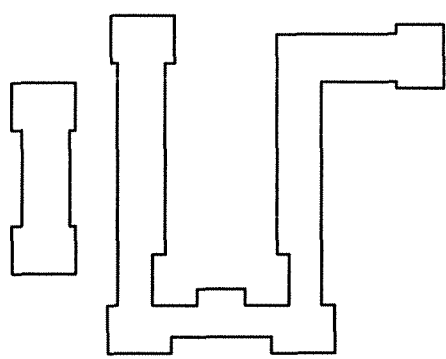
(d)
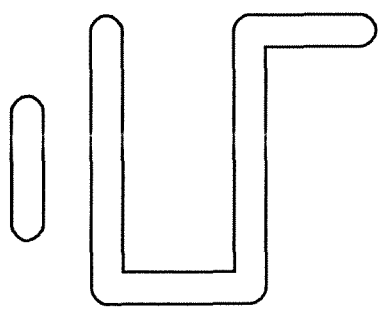
(e)
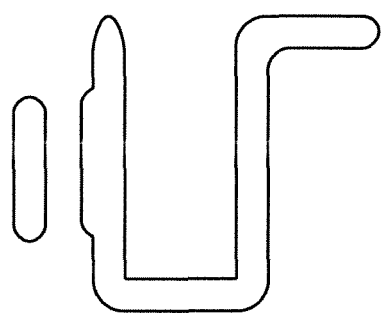

FIG. 17
(a)
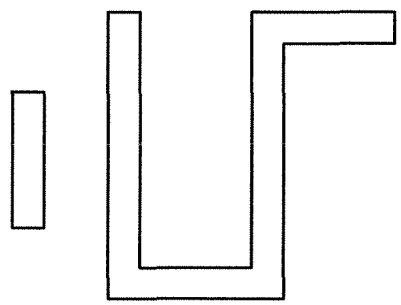
(b)
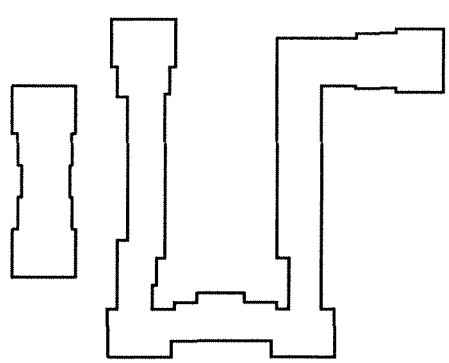
(c)
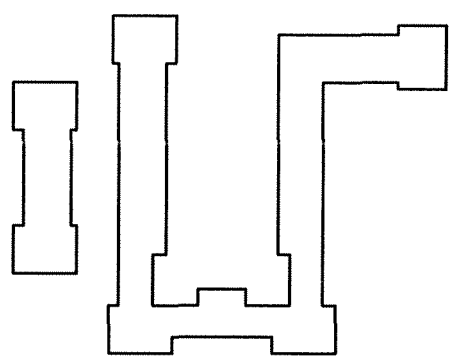
(d)
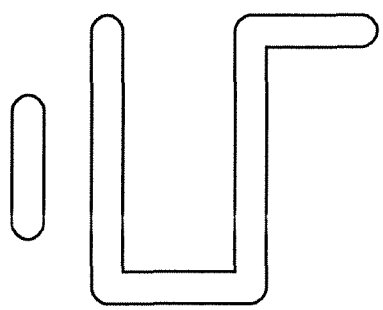
(e)
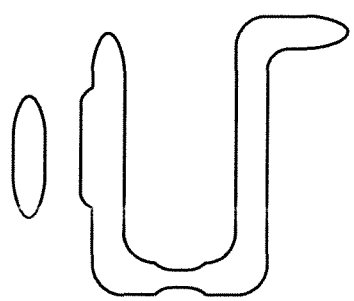

FIG. 18
(a)
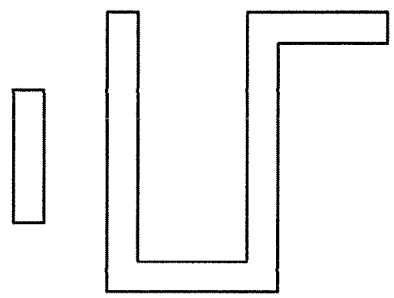
(b)
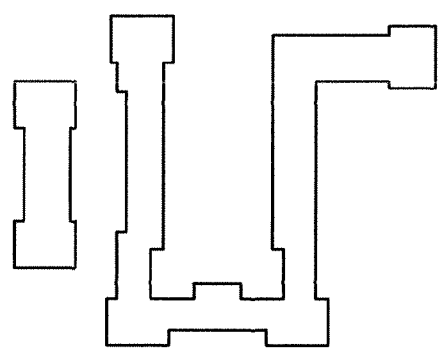
(c)
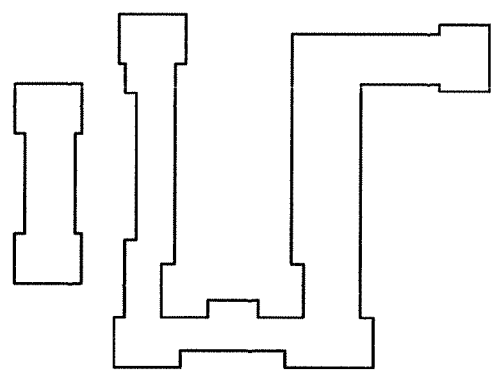
(d)
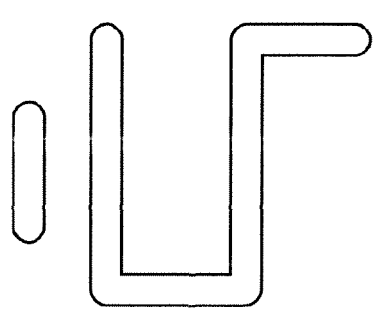
(e)
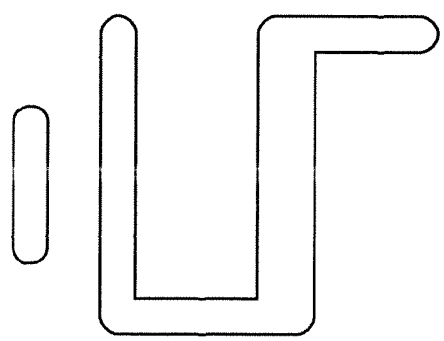

F I G. 1 9
(a)
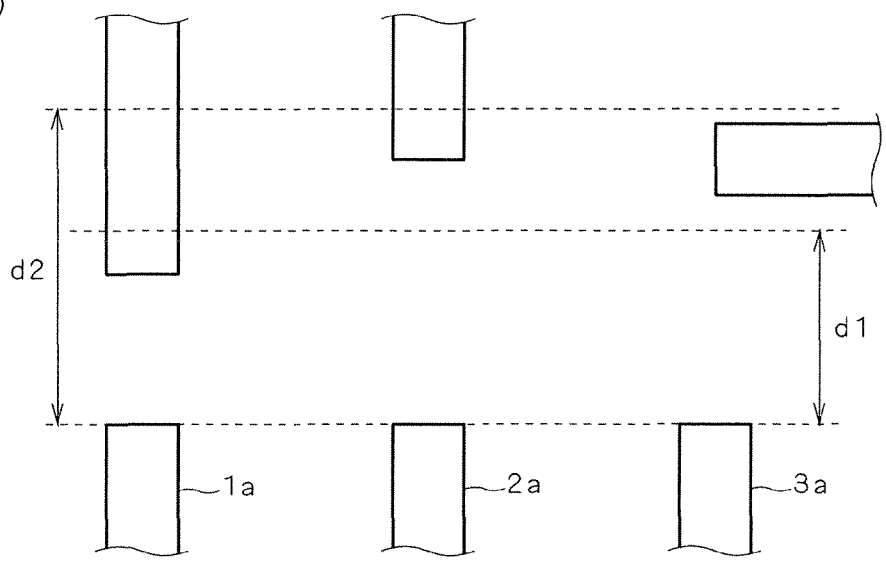
(b)
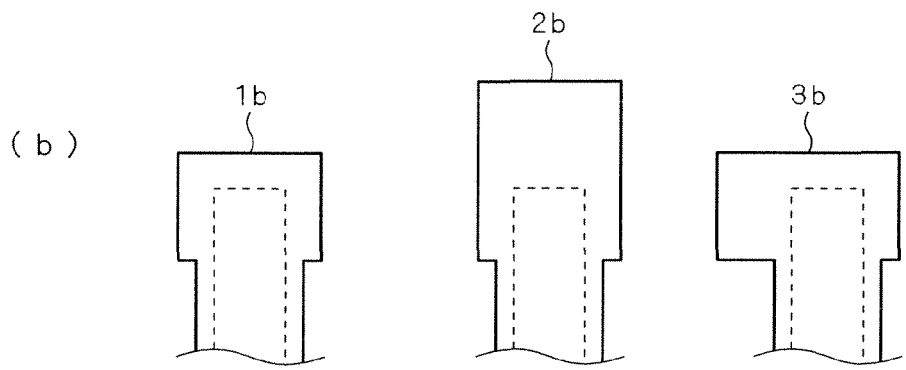
(c)
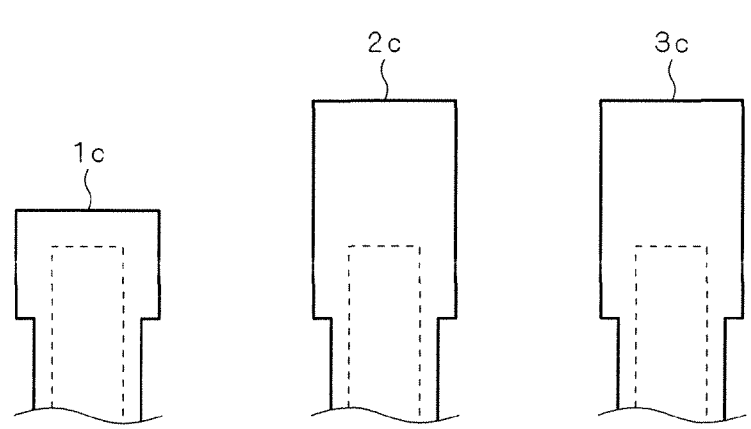
1a～1c, 2a～2c, 3a～3c : LAYOUTS FIG. 20
(a) 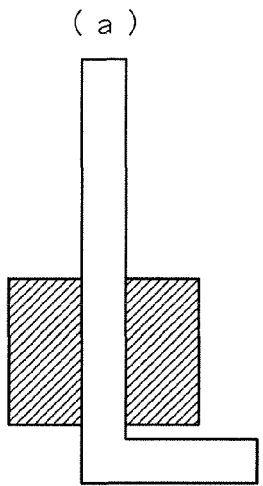
(b) 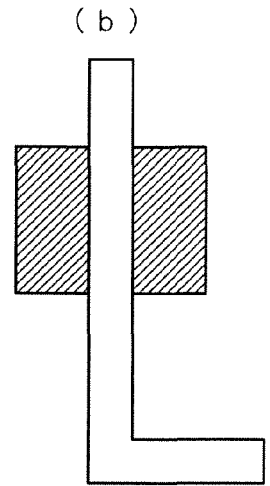
(c) 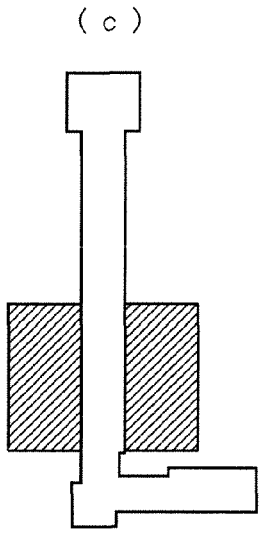
(d) 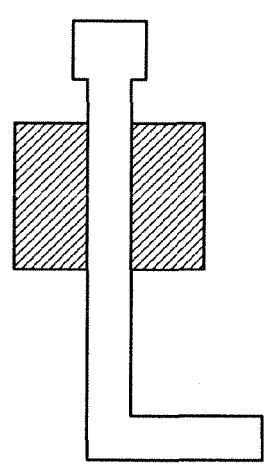
(e) 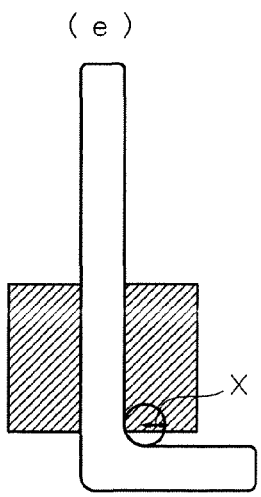
(f) 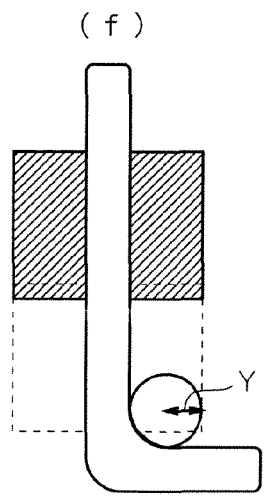

FIG. 21
(a)
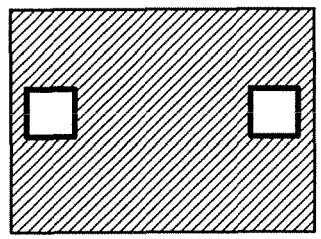
(b)
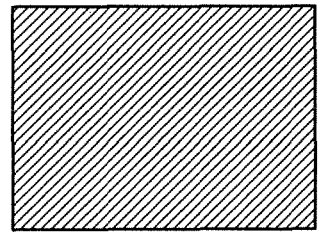
(c)
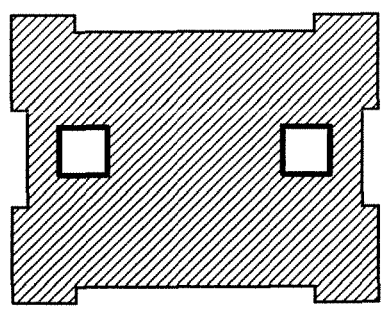
(d)
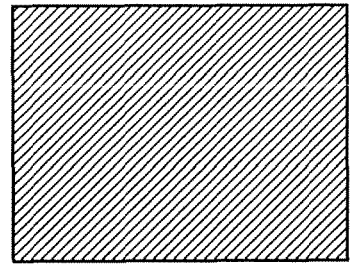
(e)
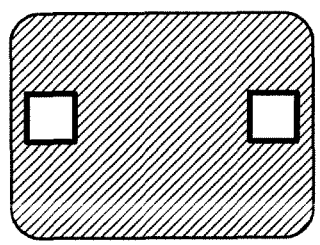
(f)
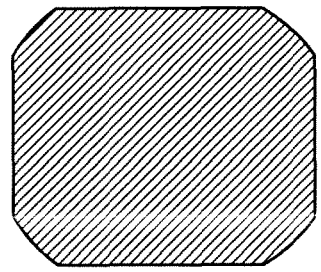

FIG. 22
(a)
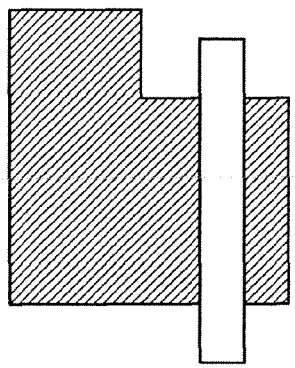
(b)
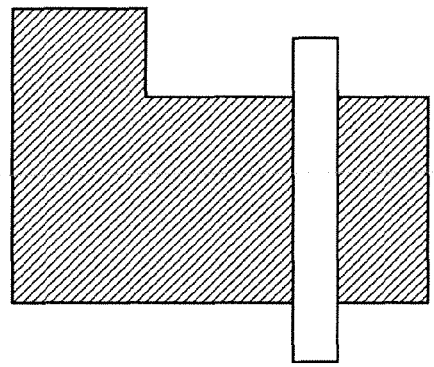
(c)
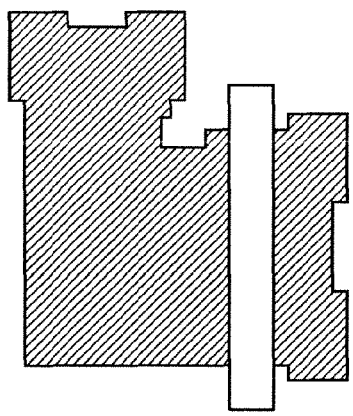
(d)
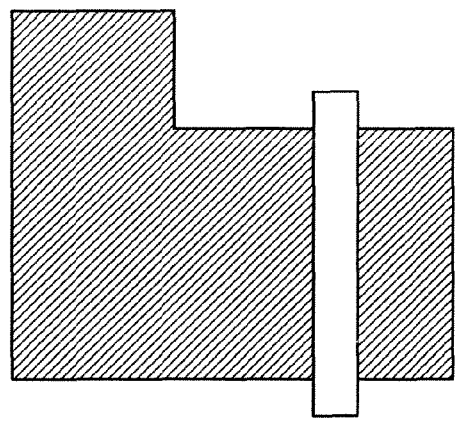
(e)
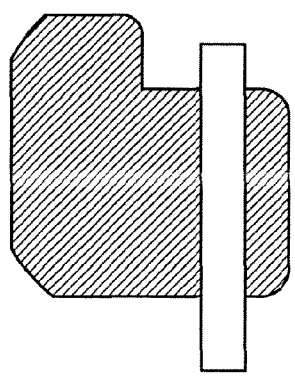
(f)
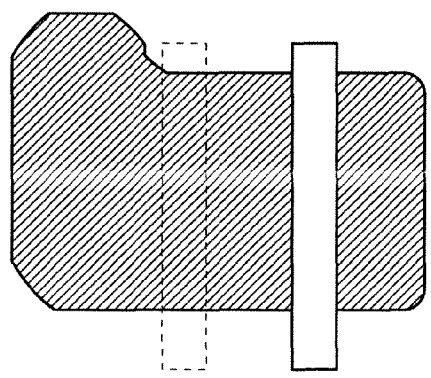

FIG. 23
(a)
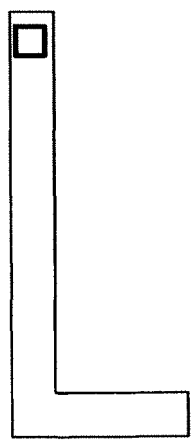
(b)
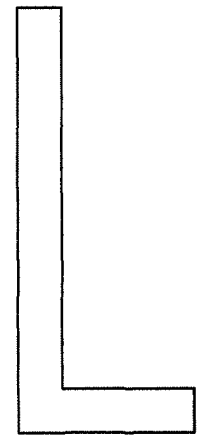
(c)
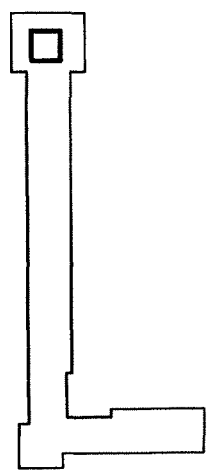
(d)
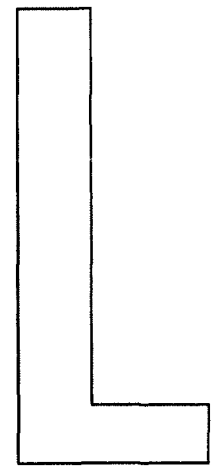
(e)
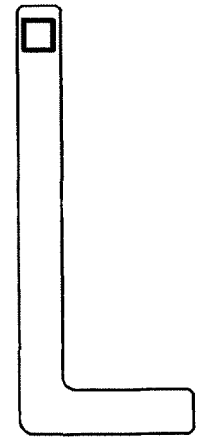
(f)
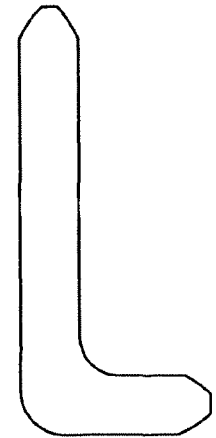

FIG. 24
(a)
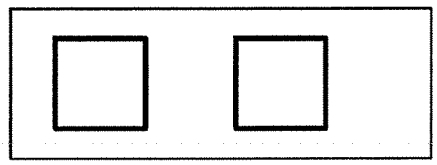
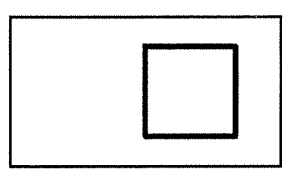
(b)
(c)
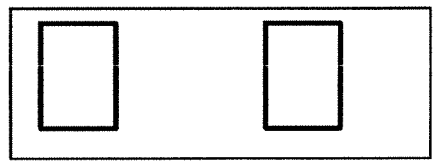
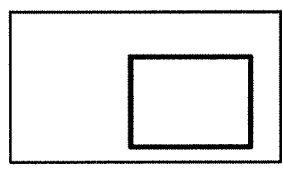
(d)
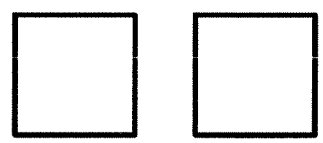
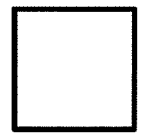
(e)
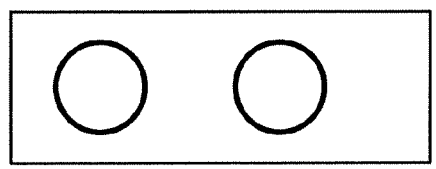
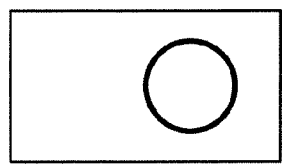
(f)
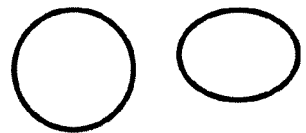
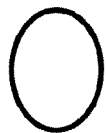

FIG. 25
(a)
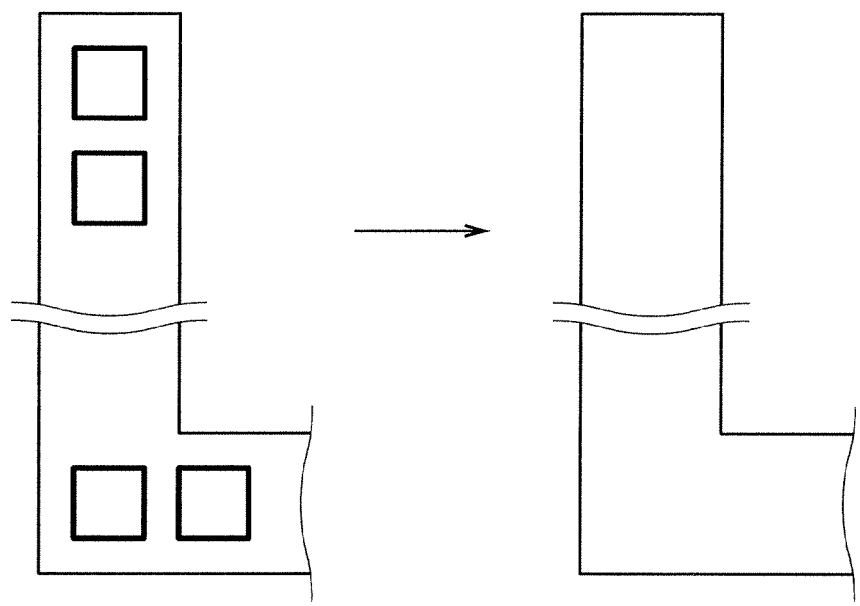
(b)
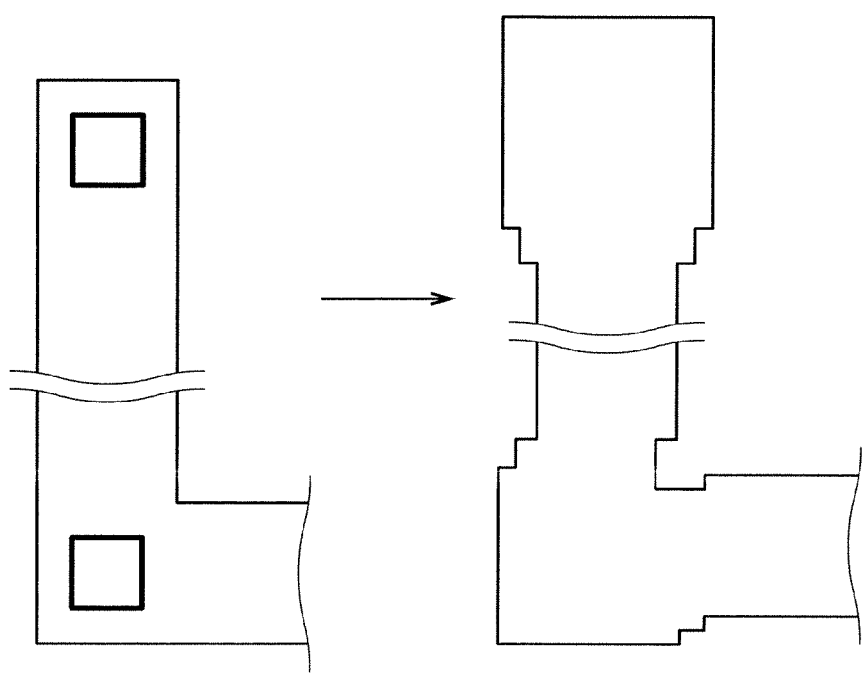

F I G . 2 6
(a)
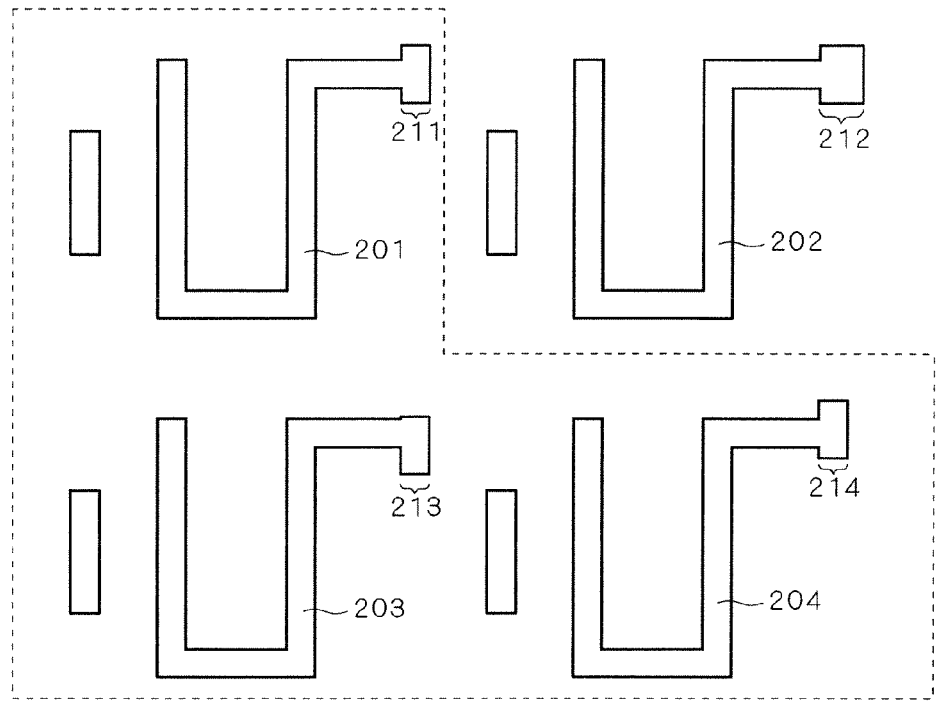
(b)
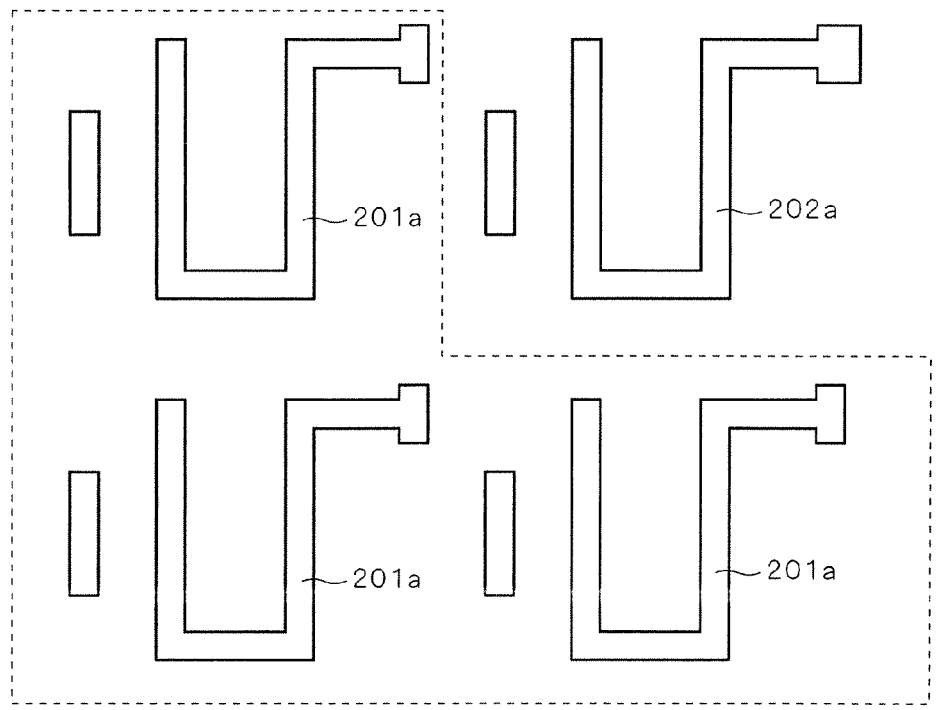
201~204, 201a~204a : POST-OPC PATTERNS
211~214 : PORTIONS FIG. 28
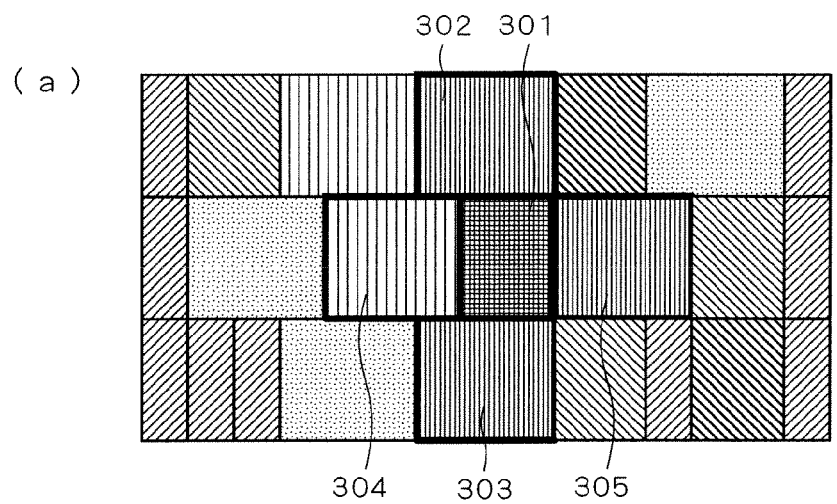
(a)
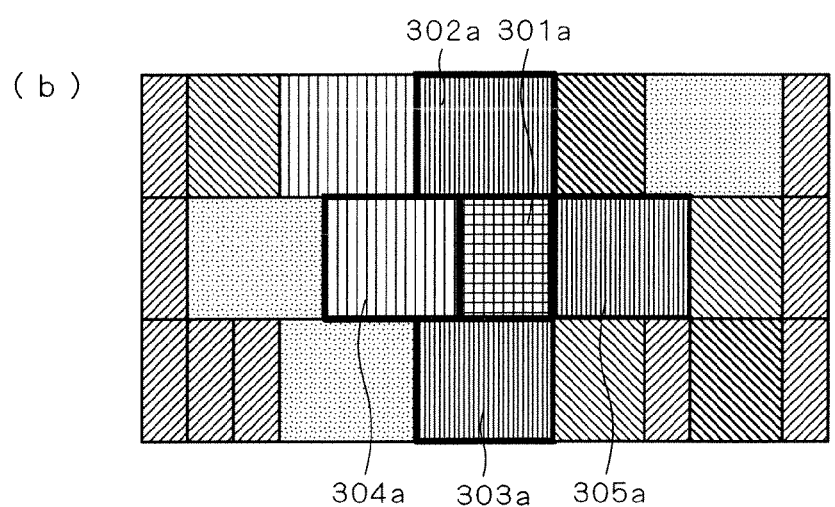
(b)
301～305 : DESIGN CELLS    301a～305a : POST-OPC CELLS FIG. 30
(a)
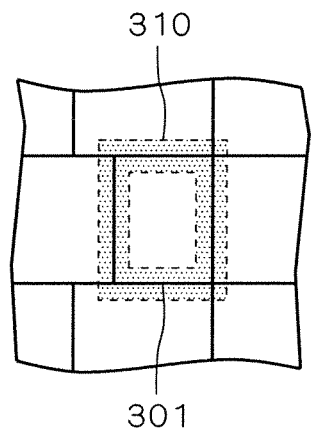
(b)
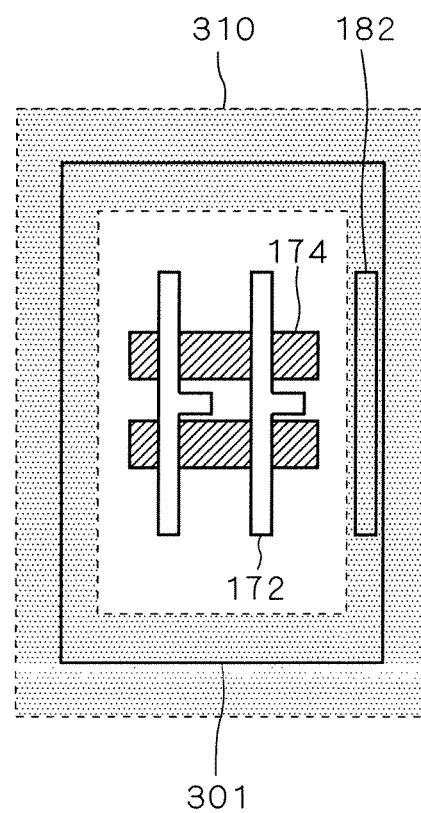

FIG. 31
(a)
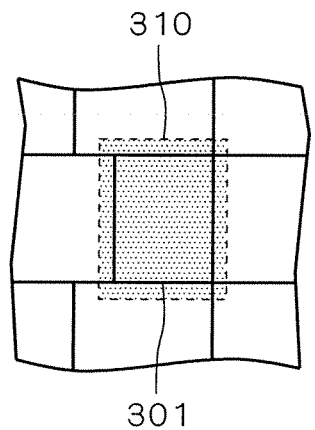
(b)
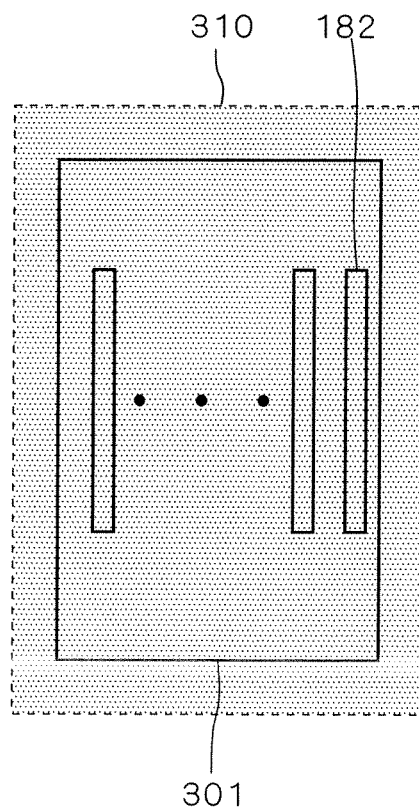

SEMICONDUCTOR DEVICE INCLUDING LOGIC CIRCUIT HAVING AREAS OF DIFFERENT OPTICAL PROXIMITY ACCURACY

RELATED APPLICATIONS

This application is a Divisional of U.S. application Ser. No. 11/919,228, filed on Oct. 25, 2007 now U.S. Pat. No. 8,103,977, which is the U.S. National Phase under 35 U.S.C. §371 of International Application No. PCT/JP2006/308620, filed on Apr. 25, 2006, which in turn claims the benefit of Japanese Application No. 2005-127798, filed on Apr. 26, 2005, the disclosures of which Applications are incorporated by reference herein.

TECHNICAL FIELD

The present invention relates to a semiconductor device and manufacturing method thereof, a mask for semiconductor manufacture, and an optical proximity correction method, and especially relates to a technique for correcting distortion caused by transfer of design patterns for semiconductor devices or the like with efficiency.

BACKGROUND ART

In conventional semiconductor device manufacturing methods, a design layout obtained by design is subjected to OPC (Optical Proximity Correction) in which corrections are made allowing for distortion due to optical proximity effects in advance; and is converted into a post-OPC layout; and is then written as a mask. Exposure onto a wafer using a mask obtained by writing results in transfer of a design pattern onto the wafer. This transfer of a design pattern does not necessarily use a mask but instead may use a post-OPC layout for direct writing onto a wafer.

The above OPC assumes the occurrence of distortion induced not only during optical lithography but also during other processes such as charged beam lithography, X-ray lithography, etching, CMP, and mask formation.

In general, there is a tradeoff between high-precision OPC processing and the cost of manufacturing a mask or wafer. That is, OPC processing with higher precision tends to increase cost.

Conventionally, rule-based OPC has been used as a main technique for OPC processing. Rule-based OPC uses parameters, such as a unit of correction steps, the number of segments of an object to be corrected, the number of correction stages for corners, the number of correction stages for line ends, and the like, to increase accuracy, but it has a problem that such increase in accuracy increases processing time and manufacturing cost.

Instead of rule-based OPC, model-based OPC has been employed in recent years. As compared to rule-based OPC in which correction rules are described by humans on the basis of pattern features like DRC (Design Rule Checker), model-based OPC uses lithography simulations to make correction while predicting the shapes of patterns formed on a wafer. Although model-based OPC improves accuracy of correction, there is the problem of increasing processing time due to chip-level simulations. The processing time in this case may range from several days to several weeks for the case of using the same processing resources as in conventional cases.

Model-based OPC, as compared to rule-based OPC, generally produces post-OPC layout patterns of more complicated shapes and thus outputs more data. Accordingly, there is the problem of further increasing the processing time required for conversion of post-OPC layouts into mask data and writing onto a wafer.

While model-based OPC uses parameters, such as unit lengths of moving edges along their lengths, the number of those units, the step of movement, and the like, to increase accuracy, such increase in accuracy increases not only resources required for OPC processing but also the number of writing data. Thus, the manufacturing cost tends to increase.

Specifically, either rule-based or model-based OPC has the problem of increasing processing time and manufacturing cost due to increase in accuracy of OPC processing.

To solve the aforementioned problem, several techniques have been suggested for reducing processing time, manufacturing cost, and the like by varying accuracy of OPC processing depending on layout types. Examples of the conventional correction techniques are disclosed for example in the following patent documents 1 to 8.

Patent Document 1: Japanese Patent Application Laid-open No. 10-199785
Patent Document 2: Japanese Patent Application Laid-open No. 10-301255
Patent Document 3: Japanese Patent Application Laid-open No. 2000-162758
Patent Document 4: Japanese Patent Application Laid-open No. 2001-100390
Patent Document 5: Japanese Patent Application Laid-open No. 2002-341514
Patent Document 6: Japanese Patent Application Laid-open No. 2003-173012
Patent Document 7: Japanese Patent Application Laid-open No. 9-319067
Patent Document 8: Japanese Patent Application Laid-open No. 2002-328457

In the conventional OPC techniques, for a memory area of a photomask which corresponds to memory, the accuracy of OPC processing is varied depending on layout types. However, these techniques cannot necessarily be said to be appropriate for a random logic area of a photomask which corresponds to a random logic circuit. Thus, there is the problem that reducing processing time and manufacturing cost may be difficult in semiconductor devices which include random logic circuits.

DISCLOSURE OF THE INVENTION

The present invention is intended to solve the aforementioned problem, and the object thereof is to provide a semiconductor device and manufacturing method thereof, a mask for semiconductor manufacture, and an optical proximity correction method, which allow reduction in processing time and manufacturing cost of a semiconductor device including a logic circuit.

One aspect of the semiconductor device according to the present invention is that the semiconductor device includes a logic circuit, wherein an area for forming the logic circuit includes a first area which is subjected to optical proximity correction with predetermined accuracy and a second area which is subjected to optical proximity correction with accuracy lower than the predetermined accuracy.

According to the aspect of the semiconductor device of the present invention, the semiconductor device including a logic circuit is capable of reducing processing time and manufacturing cost.

One aspect of the mask for semiconductor manufacture according to the present invention is that the mask for semiconductor manufacture is for manufacturing a semiconductor device including a logic circuit, wherein a mask area corresponding to the logic circuit includes a first area which is subjected to optical proximity correction with predetermined accuracy and a second area which is subjected to optical proximity correction with accuracy lower than the predetermined accuracy.

According to the aspect of the mask for semiconductor manufacture of the present invention, the semiconductor device including a logic circuit is capable of reducing processing time and manufacturing cost.

One aspect of the optical proximity correction method according to the present invention is that the optical proximity correction method is for manufacturing a semiconductor device including a logic circuit, and comprises the step (a) of making first optical proximity correction on a first area in a design layout of the logic circuit with predetermined accuracy and the step (b) of making second optical proximity correction on a second area in the design layout of the logic circuit with accuracy lower than the predetermined accuracy.

According to the aspect of the optical proximity correction method of the present invention, the semiconductor device including a logic circuit is capable of reducing processing time and manufacturing cost.

These and other objects, features, aspects and advantages of the present invention will become more apparent from the following detailed description of the present invention when taken in conjunction with the accompanying drawings.

BRIEF DESCRIPTION OF DRAWINGS

[FIGS. 1(a), 1(b), 1(c), and 1(d)] top views showing the structure of a photomask according to a first preferred embodiment.

[FIGS. 4(a), 4(b), 4(c), 4(d), and 4(e)] top views for explaining differences between low-precision OPC processing and high-precision OPC processing.

[FIGS. 5(a), 5(b), 5(c), and 5(d)] top views showing OPC processing for compensating the insufficiency of a lateral bulge in the line end in a rectangular design layout pattern.

[FIGS. 6(a), 6(b), 6(c), and 6(d)] top views showing OPC processing for reducing corner rounding in a T-shaped design layout pattern.

[FIGS. 8(a), 8(b), 8(c), 8(d), and 8(e)] top views showing a design layout pattern, post-OPC layout patterns, and finished patterns on a wafer in the semiconductor device manufacturing method according to the first preferred embodiment.

[FIGS. 10(a), 10(b), and 10(c)] schematic views showing the case in which low-precision setting and high-precision setting interact with each other.

[FIGS. 12(a), 12(b), 12(c), 12(d), 12(e), and 12(f)] top views showing features of a dummy layout pattern in the semiconductor device manufacturing method according to the first preferred embodiment.

[FIGS. 14(a), 14(b), 14(c), 14(d), and 14(e)] top views for explaining differences between high-precision OPC processing and low-precision OPC processing in the semiconductor device manufacturing method according to the first preferred embodiment.

[FIGS. 15(a), 15(b), 15(c), 15(d), and 15(e)] top views for explaining differences between high-precision OPC processing and low-precision OPC processing in the semiconductor device manufacturing method according to the first preferred embodiment.

[FIGS. 16a(a), 16(b), 16(c), 16(d), and 16(e)] top views for explaining differences between high-precision OPC processing and low-precision OPC processing in the semiconductor device manufacturing method according to the first preferred embodiment.

[FIGS. 17(a), 17(b), 17(c), 17(d), and 17(e)] top views for explaining differences between high-precision OPC processing and low-precision OPC processing in the semiconductor device manufacturing method according to the first preferred embodiment.

[FIGS. 18(a), 18(b), 18(c), 18(d), and 18(e)] top views for explaining differences between high-precision OPC processing and low-precision OPC processing in the semiconductor device manufacturing method according to the first preferred embodiment.

[FIGS. 19(a), 19(b), and 19(c)] views showing distances expanded in hierarchical processing in the semiconductor device manufacturing method according to the first preferred embodiment.

[FIGS. 20(a), 20(b), 20(c), 20(d), 20(e), and 20(f)] top views showing design layout patterns, post-OPC layout patterns, and finished patterns on a wafer in a semiconductor device manufacturing method according to a second preferred embodiment.

[FIGS. 21(a), 21(b), 21(c), 21(d), 21(e), and 21(f)] top views showing design layout patterns, post-OPC layout patterns, and finished patterns on a wafer in a semiconductor device manufacturing method according to a third preferred embodiment.

[FIGS. 22(a), 22(b), 22(c), 22(d), 22(e), and 22(f)] top views showing design layout patterns, post-OPC layout patterns, and finished patterns on a wafer in the semiconductor device manufacturing method according to the third preferred embodiment.

[FIGS. 23(a), 23(b), 23(c), 23(d), 23(e), and 23(f)] top views showing design layout patterns, post-OPC layout patterns, and finished patterns on a wafer in a semiconductor device manufacturing method according to a fourth preferred embodiment.

[FIGS. 24(a), 24(b), 24(c), 24(d), 24(e), and 24(f)] top views showing design layout patterns, post-OPC layout patterns, and finished patterns on a wafer in a semiconductor device manufacturing method according to a fifth preferred embodiment.

[FIGS. 25(a) and 25(b)] top views showing design layout patterns and post-OPC layout patterns on a wafer in the semiconductor device manufacturing method according to the fifth preferred embodiment.

[FIGS. 26(a) and 26(b)] top views showing a semiconductor device manufacturing method according to a sixth preferred embodiment.

[FIGS. 28(a) and 28(b)] top views showing a semiconductor device manufacturing method according to a seventh preferred embodiment.

[FIGS. 30(a) and 30(b)] top views showing the semiconductor device manufacturing method according to the seventh preferred embodiment.

[FIGS. 31(a) and 31(b)] top views showing the semiconductor device manufacturing method according to the seventh preferred embodiment.

BEST MODE FOR CARRYING OUT THE INVENTION

<First Preferred Embodiment>

Figure 2:
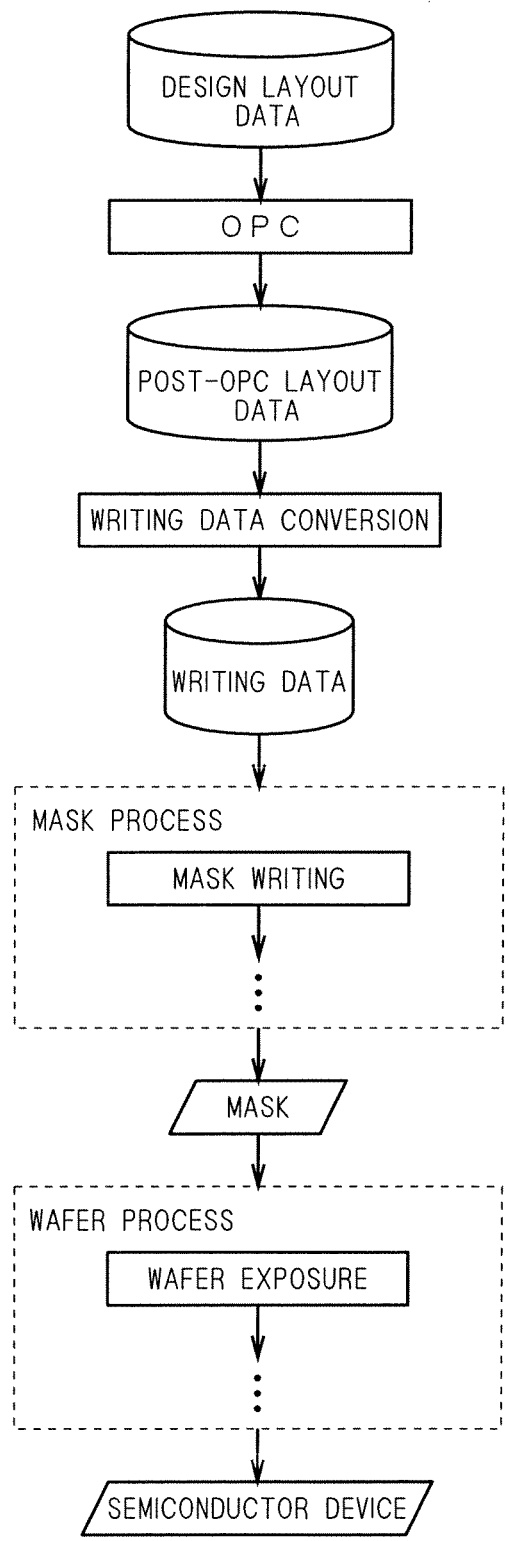
[FIG. 2] a flowchart showing a semiconductor device manufacturing method using a mask.

A semiconductor device and manufacturing method thereof, a mask for semiconductor manufacture, and an optical proximity correction method according to the first preferred embodiment have characteristic that, in a random logic area corresponding to a random logic circuit, an area which does not require high-precision processing is subjected to low-precision processing. Such accuracy control can be made by adjusting the setting of existing EDA (Electrical Design Automation) tools in which a design layout is subjected to OPC (Optical Proximity Correction) and generated into a post-OPC layout. This enables reduction in processing time and manufacturing cost.

FIGS. 1 are top views showing the structure of a photomask according to this preferred embodiment.

FIG. 1(a) shows the whole of a photomask 100. The photomask 100 comprises an IC device area 110, a mark/dicing area 120, and a mask peripheral area 130. The IC device area 110 describes an area corresponding to an IC device. The mark/dicing area 120 is provided with a mark for use in the manufacturing process, and a test pattern for use in wafer process management and wafer test. The mask peripheral area 130 has a light-shielding band provided therein.

FIG. 1(b) shows the layout of the IC device area 110 shown in FIG. 1(a). The IC device area 110 has an array of patterns formed therein and includes a memory area 112 which corresponds to a memory and a random logic area 114 which is the area other than the memory area 112 and which corresponds to a random logic circuit.

FIG. 1(c) shows the layout of the random logic area 114 shown in FIG. 1(b). The random logic area 114 is in such a form that logic blocks are arranged using automatic placement and routing (P&R) techniques and connected to each other with their terminals. Rectangular cells 114a and 114b each are a unit of logic blocks. FIG. 1(c) shows the arrangement of two types of cells: the cells 114a to be processed with low accuracy and the cells 114b to be processed with high accuracy.

Figure 3:
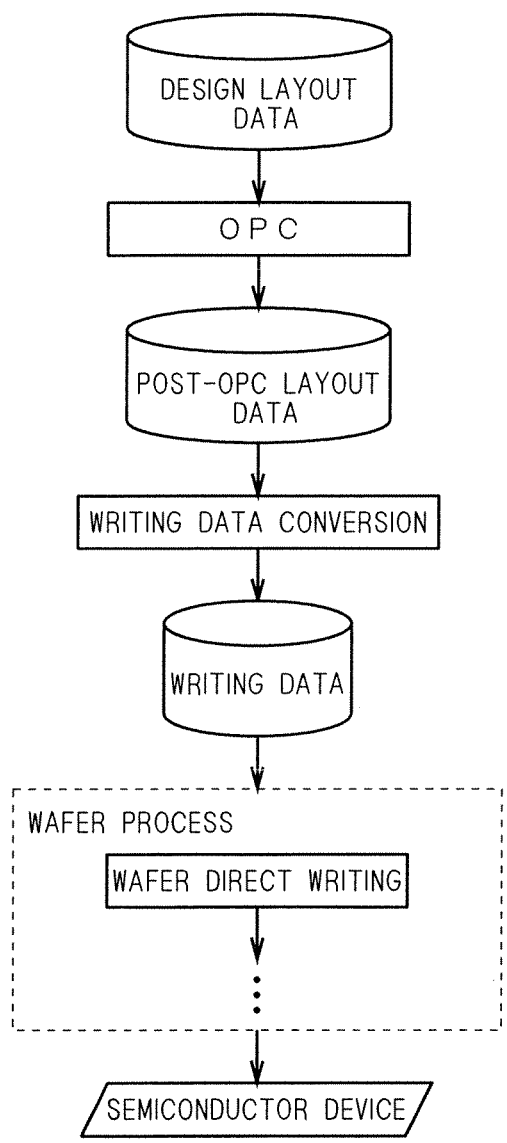
[FIG. 3] a flowchart showing a semiconductor device manufacturing method using direct writing onto a wafer.

FIG. 1(d), like FIG. 1(c), shows the structure of the random logic area 114 shown in FIG. 1(b). FIG. 1(d) shows the arrangement of two types of patterns: patterns 114c to be processed with high accuracy, shown with thin lines; and patterns 114d to be processed with low accuracy, shown with thick lines. As shown in FIG. 1(d), each pattern may be within a single cell or may extend over a plurality of cells. The area which is subjected to low-precision processing refers to, for example, the area where process variations, such as size variations and mask misalignment, have a small impact on circuit operations in the random logic part, such as logic and delay. FIG. 2 is a flowchart showing a semiconductor device manufacturing method using a mask. Referring to FIG. 2, a design layout obtained by design is subjected to OPC in which corrections are made allowing for distortion due to optical proximity effects and the like in advance, and is converted into a post-OPC layout. The post-OPC layout is converted into writing data for writing onto a mask and is then written onto a mask during a mask process. The written mask is pattern transferred onto a photoresist-coated wafer by exposure to the wafer during a wafer process. Subsequent wafer processing such as etching using the transferred pattern results in the manufacture of a semiconductor device. FIG. 3 is a flowchart showing a semiconductor manufacturing method by means of direct writing onto a wafer. Referring to FIG. 3, a design layout obtained by design is subjected to OPC in which corrections are made allowing for distortion due to optical proximity effects and the like in advance, and is converted into a post-OPC layout. The post-OPC layout is converted into writing data for writing onto a wafer and is then directly written onto a photoresist coated on a wafer during a wafer process. Subsequent wafer processing such as etching using the pattern transferred by direct writing results in the manufacture of a semiconductor device.

Next, the forms of writing data after low-precision and high-precision processing will be described with reference to FIGS. 4 to 6.

FIGS. 4 are top view for explaining differences between low-precision and high-precision OPC processing.

A design layout pattern shown in FIG. 4(a), for the case of low-precision processing, is modified into a post-OPC layout pattern shown in FIG. 4(b). The post-OPC layout pattern shown in FIG. 4(b) is, as shown in FIG. 4(c), divided into a plurality of rectangles and generated into post-OPC writing data. Since the post-OPC layout pattern shown in FIG. 4(b) is such that each edge in the design layout pattern shown in FIG. 4(a) is only uniformly biased, the number of vertices does not increase. Accordingly, the post-OPC writing data shown in FIG. 4(c) includes only three rectangles, which is small in number.

On the other hand, the design layout pattern shown in FIG. 4(a), for the case of high-precision processing, is modified into a post-OPC layout pattern shown in FIG. 4(d). The post-OPC layout pattern shown in FIG. 4(d) is, as shown in FIG. 4(e), divided into a plurality of rectangles and generated into post-OPC writing data. Since the post-OPC layout pattern shown in FIG. 4(d) is such that each edge in the design layout pattern shown in FIG. 4(a) is divided into small segments to minimize distortion, the number of vertices increases. Accordingly, the post-OPC writing data shown in FIG. 4(e) includes twenty-two rectangles, which is large in number.

Specifically, low-precision processing results in deteriorated finishing accuracy on a wafer but can reduce the number of basic patterns (rectangles in the present example) to be written by an imaging device. This enables reduction in processing time and manufacturing cost.

FIGS. 5 are top views showing OPC processing for compensating the insufficiency of a lateral bulge in the line end in a rectangular design layout pattern.

A low-precision post-OPC layout pattern shown in FIG. 5(a) has a small number of vertices (i.e., segments), but when it is transferred onto a wafer as shown in FIG. 5(b), the degree of insufficiency of a lateral bulge in the line end is rather great.

On the other hand, a high-precision post-OPC layout pattern shown in FIG. 5(c) has a large number of vertices (i.e., segments), but when it is transferred onto a wafer as shown in FIG. 5(d), the degree of insufficiency of a lateral bulge in the line end is rather small.

FIGS. 6 are top views showing OPC processing for reducing corner rounding in a T-shaped design layout pattern.

A low-precision post-OPC layout pattern shown in FIG. 6(a) has a small number of vertices (i.e., segments), but when it is transferred onto a wafer as shown in FIG. 6(b), the amount of corner rounding is rather large (the spread of the width in the direction of the arrows is great).

On the other hand, a high-precision post-OPC layout pattern shown in FIG. 6(c) has a large number of vertices (i.e., segments), but when it is transferred onto a wafer as shown in FIG. 6(d), the amount of corner rounding is rather small (the spread of the width in the direction of the arrows is small).

Figure 7:
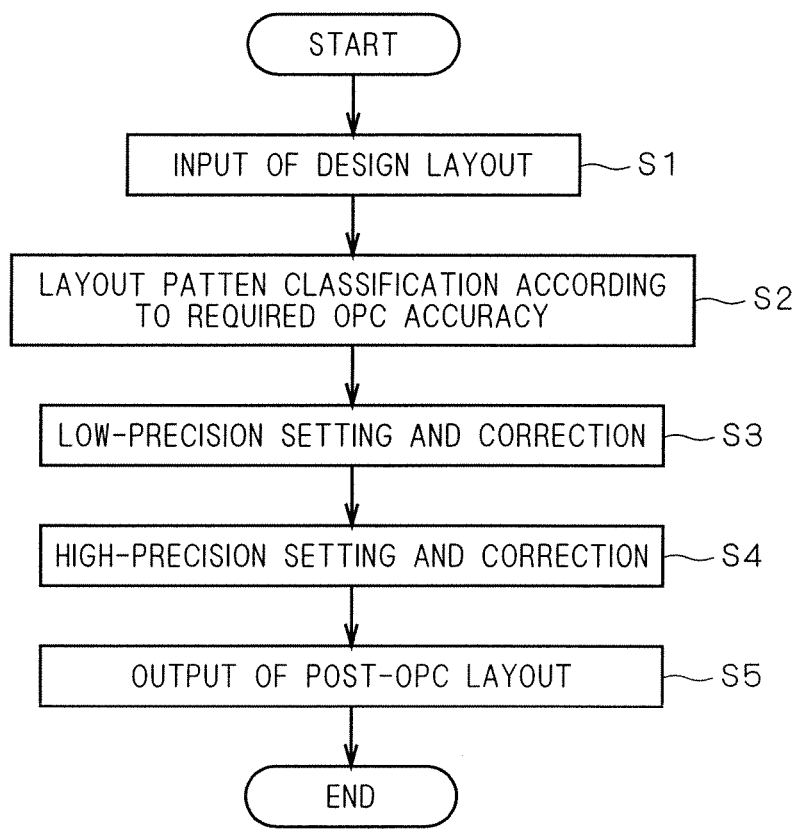
[FIG. 7] a flowchart showing an example of the semiconductor device manufacturing method according to the first preferred embodiment.

FIG. 7 is a flowchart showing one example of the OPC processing method according to this preferred embodiment.

First, step S1 is to input design layout patterns. The input design layout patterns are registered in a predetermined management database (library).

The process then goes to step S2 where the input design layout patterns in step S1 are classified according to the accuracy required for OPC. This results in the classification of the input patterns into low-precision patterns which require low accuracy and high-precision patterns which require high accuracy.

The process then goes to step S3 where the low-precision patterns classified in step S2 are subjected to setting and correction. More specifically, after parameters such as the number of vertices are determined (or set), pattern deformation (correction) is made using DRC (Design Rule Checker) functions or simulations based on the conditions determined.

The process then goes to step S4 where the high-precision patterns classified in step S2 are subjected to setting and correction. This setting is to set parameters, referring to the parameters determined in step S3. Thus, even if the setting in step S3 affects the setting in step S4, appropriate parameters can be set in accordance with this influence. The contents of concrete processing are as described in step S3. While, as described, the processing in step S4 is done in consideration of the correction results (post-OPC layout patterns) in step S3, the processing in step S3 is done without referring to the results of high-precision corrections. Thus, in this regard, the processing time can be shortened. Here, steps S3 and S4 are interchangeable in the order of processing. However, because precedent processing cannot take the result of post-processing into consideration, high-precision correction should desirably be done as post-processing that can refer to the result of precedent processing.

The process then goes to step S5 where the post-OPC layout patterns obtained through corrections in steps S3 and S4 are outputted.

Through the aforementioned steps S1 to S5, post-OPC layout patterns are generated and outputted based on input design layout patterns. The aforementioned processing even allows layout patterns of similar shapes in the random logic area 114 or the like to be processed with different degrees of accuracy into different shapes. Although the above description has explained the case where the low-precision setting and correction in step S3 are followed by the high-precision setting and correction in step S4, the present invention is not limited thereto. For example, as will be described later with reference to FIG. 9, low-precision setting and high-precision setting may be done first and then low-precision and high-precision corrections may be done collectively.

FIGS. 8 are top views for explaining differences between high-precision OPC processing and low-precision OPC processing. FIG. 8(a) shows a design layout pattern; FIGS. 8(b) and 8(c) show post-OPC layout patterns resulting from high-precision OPC processing and low-precision OPC processing, respectively; and FIGS. 8(d) and 8(e) show finished patterns on a wafer resulting from high-precision OPC processing and low-precision OPC processing, respectively.

The design layout pattern shown in FIG. 8(a), for the case of high-precision processing, is modified into the post-OPC layout pattern shown in FIG. 8(b). The post-OPC layout pattern shown in FIG. 8(b) is transferred onto a wafer as shown in FIG. 8(d). The post-OPC layout pattern shown in FIG. 8(b) is such that corrections which allow for distortion, such as line-end pullback and corner rounding, in advance are made on the design layout pattern shown in FIG. 8(a). Accordingly, the finished pattern on a wafer shown in FIG. 8(d) has a small amount of distortion such as line-end pullback and corner rounding.

On the other hand, the design layout pattern shown in FIG. 8(a), for the case of low-precision processing, is modified into the post-OPC layout pattern shown in FIG. 8(c). The post-OPC layout pattern shown in FIG. 8(c) is transferred onto a wafer as shown in FIG. 8(e). The post-OPC layout pattern shown in FIG. 8(c) is such that each line in the design layout pattern shown in FIG. 8(a) is only uniformly biased to increase the width, allowing for line-end pullback in advance. Accordingly, the finished pattern on a wafer shown in FIG. 8(e) has not so much line-end pullback, but as compared to that in FIG. 8(d), it has more residual distortion such as corner rounding.

Figure 9:
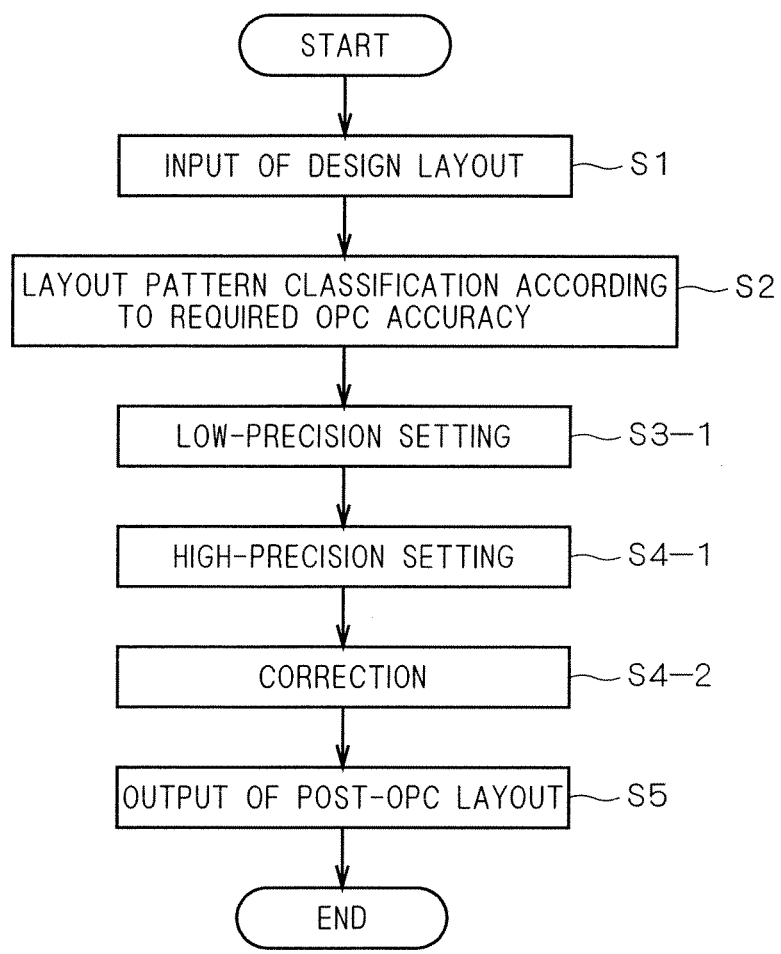
[FIG. 9] a flowchart showing another example of the semiconductor device manufacturing method according to the first preferred embodiment.

FIG. 9 is a flowchart showing another example of the OPC processing method according to this preferred embodiment. FIG. 9 differs from the flowchart of FIG. 7 in that step S3 is replaced by step S3-1, and that step S4 is replaced by steps S4-1 and S4-2.

Step S3-1 performs only the setting of the low-precision patterns classified in step S2. Step S4-1 performs only the setting of the high-precision patterns classified in step S2. Step S4-2 performs low-precision and high-precision corrections collectively. Hereinbelow the reason why corrections are made collectively will be described.

In the flowchart shown in FIG. 7, low-precision setting and correction are done first in step S3 and then high-precision setting and correction are done in step S4. Thus, proper setting is sometimes difficult, especially when the high-precision setting and correction and the low-precision setting and correction interact with each other.

FIGS. 10 are schematic views showing the case where high-precision correction affects low-precision correction. FIG. 10(a) shows a design layout in which an area 150 that requires high-precision processing and an area 160 that allows low-precision processing are located close to each other. If the correction of the area 160 (step S3) is done before the setting of the area 150 (step S4) as shown in FIG. 7, finished patterns can pull back because, as shown in FIG. 10(b), the correction result of an area 160a which is a post-OPC layout pattern becomes an obstacle to high-precision correction of an area 150a, which thus cannot extend toward the area 160 (the areas 150 and 160 are shown with dotted lines, and finished patterns on a wafer are shown with curves). On the other hand, in the flowchart shown in FIG. 9, steps S3-1 and S4-1 each perform only setting, and step S4-2 performs corrections collectively, referring to the influence of each setting on the other. Thus, as compared to the case in the flowchart shown in FIG. 7, corrections that satisfy the required accuracy become possible. FIG. 10(c) shows one example thereof. To ensure a sufficient degree of finished quality of an area 150b on a wafer, the degree of finished quality of an area 160b is reduced for compensation purposes. Accordingly, in the flowchart shown in FIG. 9, proper setting is possible even for the case where low-precision correction affects high-precision correction.

The technique for making corrections while referring to the interaction between each other is applicable to both rule-based and model-based OPC. Specifically, in rule-based OPC which uses design layout patterns obtained before the application of OPC for parameter setting, some of the parameters can be set by referring to other layout patterns obtained after the application of OPC. In model-based OPC, parameter setting and simulations can be accomplished by referring to other layout patterns obtained after the application of OPC.

The flowchart shown in FIG. 7, as compared to that shown in FIG. 9, reduces process load. Thus, for example for the case where the areas 150 and 160 are spaced away from each other and there is a small influence of high-precision setting on low-precision setting, the processing as shown in FIG. 7 enables efficient use of OPC processing resources.

Figure 11:
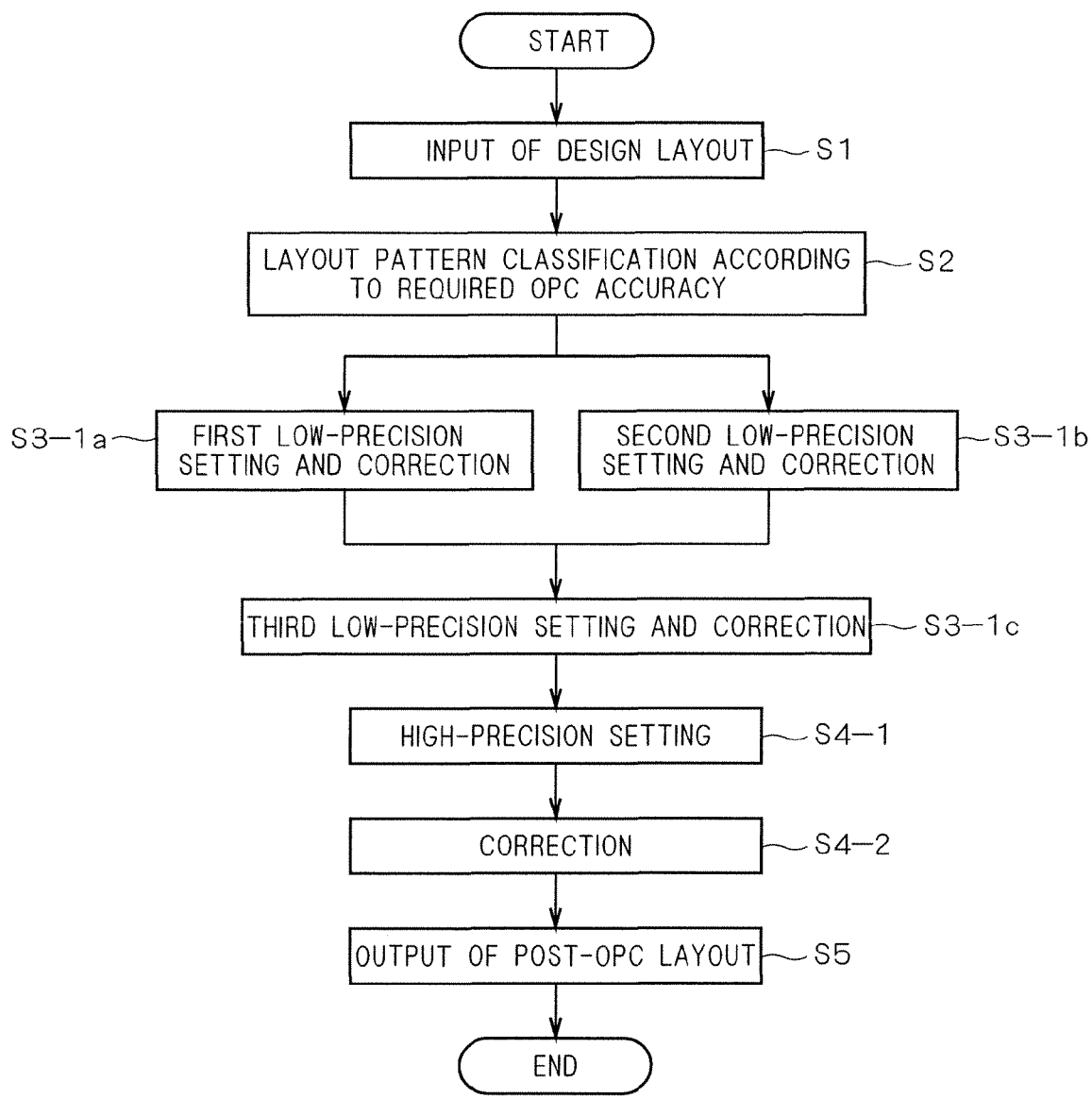
[FIG. 11] a flowchart showing still another example of the semiconductor device manufacturing method according to the first preferred embodiment.
Figure 13:
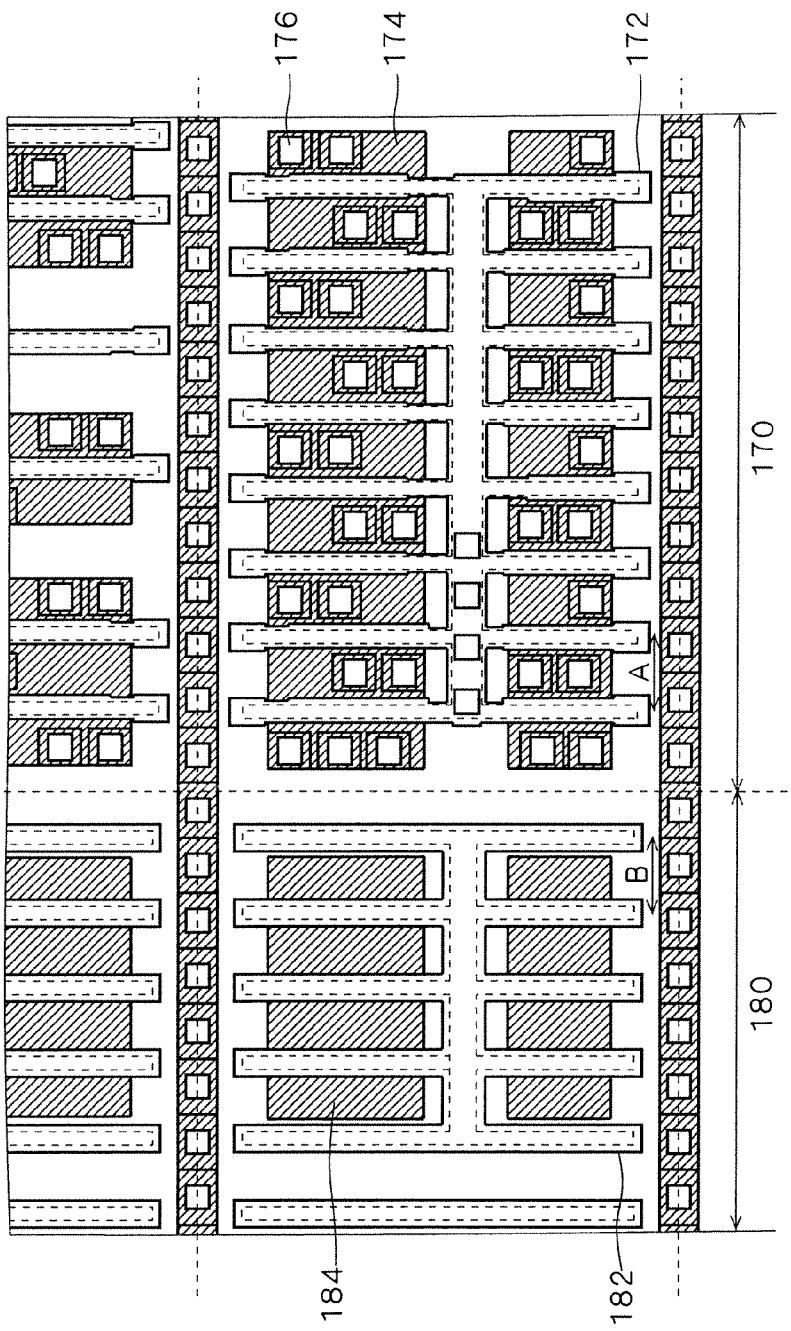
[FIGS. 13(a) and 13(b)] top views showing features of the dummy layout pattern in the semiconductor device manufacturing method according to the first preferred embodiment.

FIG. 11 is a flowchart showing still another example of the OPC processing method according to this preferred embodiment. FIG. 11 differs from the flowchart of FIG. 9 in that step S3-1 is replaced by steps S3-1a to S3-1c.

Step S3-1a performs setting and correction of first low-precision patterns classified in step S2. Step S3-1b performs setting and correction of second low-precision patterns classified in step S2. The first and second low-precision patterns neither interact with each other nor are affected by processing of other patterns, and thus can be processed in parallel until their corrections are completed. Step S3-1c performs the setting of third low-precision patterns classified in step S2. The setting of the third low-precision patterns is affected by the setting of the first and second low-precision patterns, and is thus performed in the post-stage of the setting of the first and second low-precision patterns. The setting of the third low-precision patterns is also affected by the setting of high-precision patterns in step S4-1. Thus, for the third low-precision patterns, only the setting thereof is performed in step S3-1c, and after the setting of high-precision patterns is completed in step S4-1, corrections are collectively performed in step S4-2. In this way, performing in parallel the setting of the first and second low-precision patterns which do not interact with each other shortens processing time as compared to the case shown in the flowchart of FIG. 9.

Next, a technique for extracting from the random logic area 114, dummy layout patterns which do not actually act as high-speed transistors will be described with reference to FIGS. 12 to 18. Performing low-precision processing on dummy layout patterns enables reduction in processing time and manufacturing cost.

More specifically, extracting areas which do not act as gates in a design layout pattern corresponding to a gate layer in the random logic area 114 results in the extraction of dummy layout patterns. Examples of these dummy layout patterns include dummy gates which are inserted in order to keep a constant local area ratio, and elements such as capacitance, resistance, and diodes.

FIGS. 12 are top views showing features of the dummy layout patterns.

Conductive layers (conductive areas) acting as transistors, which are formed of conductive materials such as polysilicon and used as gate interconnection lines of transistors, overlap with active layers (active areas). Thus, focusing on layout patterns which do not overlap with active layers allows the extraction of dummy layout patterns.

FIG. 12(a) shows a layout pattern of conductive layer which overlaps with an active layer (hatched area); and FIG. 12(b) shows a layout pattern of conductive layer which does not overlap with any active layer. Specifically, the layout pattern shown in FIG. 12(a) requires high-precision processing because it acts as a transistor, while the layout pattern shown in FIG. 12(b) does not require high-precision processing because it does not act as a transistor. Accordingly, extracting layout patterns of conductive layer which do not overlap with active layer as shown in FIG. 12(b), using existing DRC tools, and subjecting them to low-precision processing enable reduction in processing time and manufacturing.

Even though conductive layers overlap with active layers, those which have no contact pads for receiving contacts do not act as transistors because they are not connected to the other layers. Thus, focusing on layout patterns which have no contact pads also allows the extraction of dummy layout patterns.

FIG. 12(c) shows a layout pattern of conductive layer which has partially widened ends or pad patterns corresponding to contact pads, and FIG. 12(d) shows a layout pattern of conductive layer which has no pad pattern corresponding to a contact pad. Specifically, the layout pattern shown in FIG. 12(c) requires high-precision processing because it acts as a transistor, while the layout pattern shown in FIG. 12(d) does not require high-precision processing because it does not act as a transistor. Accordingly, extracting layout patterns of conductive layer which do not have pad patterns corresponding to contact pads as shown in FIG. 12(d), using existing DRC tools, and subjecting them to low-precision processing enable reduction in processing time and manufacturing. Although there can be some transistors whose pattern widths are sufficiently large so that no contact pad is necessary, high-speed transistors generally have small linewidths and thus need contact pads in areas other than the areas of overlap with active layers (hatched areas) as shown in FIG. 12(c). That is, for the case where only such conductors as having small linewidths are located as gate interconnection lines of transistors, the aforementioned technique can be employed to extract dummy patterns. High-speed transistors refer to, for example, such transistors in the random logic area that operate at high speed, having gate lengths close to the minimum machining dimension and with smaller linewidths than low-speed transistors which are formed in low-precision areas and which have gate lengths with great linewidths.

Even though conductive layers overlap with active layers and have contact pads formed in areas other than the areas of overlap with active layers, those whose contact pads are connected to no contact do not act as transistors because they are not connected to the other layers. Thus, focusing on layout patterns which are not connected to any contact also allows the extraction of dummy layout patterns.

FIG. 12(e) shows a layout pattern of conductive layer which is connected to a pattern (shown with thick line) corresponding to a contact at its partially widened end (first wide portion), and FIG. 12(f) shows a layout pattern of conductive layer which is not connected to any pattern corresponding to a contact at its partially widened end (second wide portion). Specifically, the layout pattern shown in FIG. 12(e) requires high-precision processing because it acts as a transistor, while the layout pattern shown in FIG. 12(f) does not require high-precision processing because it does not act as a transistor. Accordingly, extracting layout patterns of conductive layer which are not connected to the patterns corresponding to contacts as shown in FIG. 12(f), using existing DRC tools, and subjecting them to low-precision processing enable reduction in processing time and manufacturing. Further, as shown in FIG. 13(a), conductive layers which have large widths on active layers and have contacts formed thereon are sometimes used as capacitances. These layers can also be treated as dummy layout patterns.

FIG. 13(b) shows, by way of example, a post-OPC layout including a high-precision area 170 and a low-precision area 180 in adjacent design cells.

In the high-precision area 170, gate interconnection lines 172 formed across active areas 174, and contacts 176 formed to provide electrical connection with the active areas 174 are laid out. In the low-precision area 180, dummy gate interconnection lines 182 formed across dummy active areas 184 are laid out.

On the active areas 174, the gate interconnection lines 172 formed of conductive layer are formed via a gate insulating film. The active areas 174 located on both sides of the gate interconnection lines 172 serve as source and drain regions, respectively, thus forming a first transistor. On the dummy active areas 184, the dummy gate interconnection lines 182 formed of conductive layer are formed via a gate insulating film.

The high-precision area 170 acting as transistors is subjected to high-precision OPC processing, in which corrections allowing for distortion, such as line-end pullback and corner rounding, in advance are made on the gate interconnection lines 172 in the design layout. The low-precision area 180 not acting as transistors is subjected to low-precision OPC processing, in which, for example, the dummy interconnection lines 182 are only uniformly biased to increase the widths, or each edge is subjected to low-precision OPC processing without edge segmentation. Specifically, the gate interconnection lines 172 and the dummy gate interconnection lines 182 each have an end and a L-shaped bend, and they are corrected so that the inside diameters of the bends of the gate interconnection lines 172 become smaller than those of the bends of the dummy gate interconnection lines 182 and that the bulges in the ends of the gate interconnection lines 172 become larger than those in the ends of the dummy gate interconnection lines 182. Accordingly, as shown in FIG. 13(b), extracting the layout patterns of the dummy active areas 184 which are not connected to the patterns corresponding to the contacts 176, using existing DRC tools, and subjecting corresponding design cells to low-precision processing enable reduction in processing time and manufacturing cost.

The respective gate interconnection lines 172 in the high-precision area 170 are formed with predetermined first pitches A along a direction generally perpendicular to the long edges of the generally rectangle active areas 174, with their one ends connected to each other and with their other ends terminating outside the active areas 174. Similarly, the respective dummy gate interconnection lines 182 in the low-precision area 180 are formed with predetermined second pitches B along a direction generally perpendicular to the long edges of the generally rectangle dummy active areas 184, with their one ends connected to each other and with their other ends terminating outside the dummy active areas 184. Here, the dummy gate interconnection lines 182 are inserted in order to keep a constant local area ratio for the purpose of reducing the influence of a difference in device density during photolithography, etching, and planarization. Accordingly, the first pitches A and the second pitches B should preferably be close in value to each other, so in this preferred embodiment, they are equal to each other.

The finished pattern on a wafer, formed using these layout patterns, has become such that, as seen from the comparison of the terminating ends (the other ends in the above description) of the gates, the bulges of the dummy gate interconnection lines 182 are smaller than those of the gate interconnection lines 172 as shown in FIGS. 5. Also, as seen from the comparison of rounding of the L-shaped bends on the side (one ends in the above description) where the gates are connected to each other, the rounding of the dummy gate interconnection lines 182 is larger than that of the gate interconnection lines 172 as shown in FIGS. 6.

Next, referring to FIGS. 14 to 18, distortion of layout patterns resulting from low-precision OPC will be described by comparison with that resulting from high-precision OPC.

FIGS. 14 are top views for explaining differences between high-precision OPC processing, and low-precision OPC processing in which a uniform bias is applied. FIG. 14(a) shows a design layout pattern; FIGS. 14(b) and 14(c) show post-OPC layout patterns resulting from high-precision OPC processing and low-precision OPC processing, respectively; and FIGS. 14(d) and 14(e) show finished patterns on a wafer resulting from high-precision OPC processing and low-precision OPC processing, respectively.

The design layout pattern shown in FIG. 14(a), for the case of high-precision processing, is modified into the post-OPC layout pattern shown in FIG. 14(b). The post-OPC layout pattern shown in FIG. 14(b) is transferred onto a wafer as shown in FIG. 14(d). The post-OPC layout pattern shown in FIG. 14(b) is such that corrections allowing for distortion, such as line-end pullback, corner rounding, and the influences of adjacent patterns, in advance are made on the design layout pattern shown in FIG. 14(a). Accordingly, the finished pattern on a wafer shown in FIG. 14(d) has a small amount of distortion such as line-end pullback, corner rounding, and the influences of adjacent patterns.

On the other hand, for the case of low-precision processing in which a uniform bias is applied without consideration of line ends, corners, and the influences of adjacent patterns, the design layout pattern shown in FIG. 14(a) is modified into the post-OPC layout pattern shown in FIG. 14(c). The post-OPC layout pattern shown in FIG. 14(c) is transferred onto a wafer as shown in FIG. 14(e). The post-OPC layout pattern shown in FIG. 14(c) is such that each line in the design layout pattern shown in FIG. 14(a) is only uniformly biased to increase the width. Accordingly, the finished pattern on a wafer shown in FIG. 14(e), as compared to that in FIG. 14(d), exhibits low critical dimension (CD) accuracy, for example with residual distortion such as a large amount of line-end pullback, a small amount of lateral bulge in the line end, a large amount of corner rounding, and the influences of adjacent patterns, or with variations in linewidth. For example, random logic areas often employs several kinds of linewidths with respect to the minimum linewidth, but this can cause random variations in linewidth in such areas that have been subjected to low-precision processing.

FIGS. 15 are top views for explaining differences between high-precision OPC processing, and low-precision OPC processing in which edge positions are corrected with high accuracy without edge segmentation. FIG. 15(a) shows a design layout pattern; FIGS. 15(b) and 15(c) show post-OPC layout patterns resulting from high-precision OPC processing and low-precision OPC processing, respectively; and FIGS. 15(d) and 15(e) show finished layout patterns on a wafer resulting from high-precision OPC processing and low-precision OPC processing, respectively.

The design layout pattern shown in FIG. 15(a), for the case of high-precision processing, is modified into the post-OPC layout pattern shown in FIG. 15(b). The post-OPC layout pattern shown in FIG. 15(b) is transferred onto a wafer as shown in FIG. 15(d). The post-OPC layout pattern shown in FIG. 15(b) is such that corrections allowing for distortion, such as line-end pullback, corner rounding, and the influences of adjacent patterns, in advance are made on the design layout pattern shown in FIG. 15(*a*). Accordingly, the finished pattern on a wafer shown in FIG. 15(*d*) has a small amount of distortion such as line-end pullback, corner rounding, and the influences of adjacent patterns.

On the other hand, for the case of low-precision processing in which edge positions are corrected with high accuracy without edge segmentation, i.e., without correcting line ends and corners, the design layout pattern shown in FIG. 15(*a*) is modified into the post-OPC layout pattern shown in FIG. 15(*c*). The post-OPC layout pattern shown in FIG. 15(*c*) is transferred onto a wafer as shown in FIG. 15(*e*). The post-OPC layout pattern shown in FIG. 15(*c*) is such that edge positions in the design layout pattern shown in FIG. 15(*a*) are corrected with high accuracy without edge segmentation. Accordingly, the finished pattern on a wafer shown in FIG. 15(*e*) has similar finished quality of the edges as shown in FIG. 15(*d*), but as compared to that shown in FIG. 15(*d*), it has more residual distortion such as a large amount of line-end pullback, a small amount of lateral bulge in the line end, and a large amount of corner rounding.

FIGS. 16 are top views for explaining differences between high-precision OPC processing, and low-precision OPC processing in which the number of edge segments is somewhat reduced. FIG. 16(*a*) shows a design layout pattern; FIGS. 16(*b*) and 16(*c*) show post-OPC layout patterns resulting from high-precision OPC processing and low-precision OPC processing, respectively; and FIGS. 16(*d*) and 16(*e*) show finished layout patterns on a wafer resulting from high-precision OPC processing and low-precision OPC processing, respectively.

The design layout pattern shown in FIG. 16(*a*), for the case of high-precision processing, is modified into the post-OPC layout pattern shown in FIG. 16(*b*). The post-OPC layout pattern shown in FIG. 16(*b*) is transferred onto a wafer as shown in FIG. 16(*d*). The post-OPC layout pattern shown in FIG. 16(*b*) is such that corrections allowing for distortion, such as line-end pullback, corner rounding, and the influences of adjacent patterns, in advance are made on the design layout pattern shown in FIG. 16(*a*). Accordingly, the finished pattern on a wafer shown in FIG. 16(*d*) has a small amount of distortion such as line-end pullback, corner rounding, and the influences of adjacent patterns.

On the other hand, for the case of low-precision processing in which the number of edge segments is somewhat reduced as compared to the case of high-precision processing, e.g., the number of stages at pattern edge corners, such as hammerheads, inner hammerheads, serifs, and inner serifs, is reduced, or the number of edge segments is reduced in view of both its own and other patterns, the design layout pattern shown in FIG. 16(*a*) is modified into the post-OPC layout pattern shown in FIG. 16(*c*). The post-OPC layout pattern shown in FIG. 16(*c*) is transferred onto a wafer as shown in FIG. 16(*e*). The post-OPC layout pattern shown in FIG. 16(*c*) is such that corrections allowing for distortion, such as line-end pullback, corner rounding, and the influences of adjacent patterns, in advance are made on the design layout pattern shown in FIG. 16(*a*), with a somewhat reduced number of segments. Accordingly, the finished pattern on a wafer shown in FIG. 16(*e*), as compared to that in FIG. 16(*d*), has more residual distortion such as a somewhat large amount of line-end pullback, a somewhat small amount of lateral bulge in the line end, a somewhat large amount of corner rounding, and the influences of adjacent patterns.

FIGS. 17 are top views for explaining differences between high-precision rule-based OPC processing, and low-precision rule-based OPC processing in which correction specifications are somewhat simplified (e.g., the number of pattern size groups classified during correction is reduced, or the number of edge segments at corners or line ends is reduced). FIG. 17(*a*) shows a design layout pattern; FIGS. 17(*b*) and 17(*c*) show post-OPC layout patterns resulting from high-precision OPC processing and low-precision OPC processing, respectively; and FIGS. 17(*d*) and 17(*e*) show finished patterns on a wafer resulting from high-precision OPC processing and low-precision OPC processing, respectively.

The design layout pattern shown in FIG. 17(*a*), for the case of high-precision processing, is modified into the post-OPC layout pattern shown in FIG. 17(*b*). The post-OPC layout pattern shown in FIG. 17(*b*) is transferred onto a wafer as shown in FIG. 17(*d*). The post-OPC layout pattern shown in FIG. 17(*b*) is such that corrections allowing for distortion, such as line-end pullback, corner rounding, and the influences of adjacent patterns, in advance are made on the design layout pattern shown in FIG. 17(*a*). Accordingly, the finished pattern on a wafer shown in FIG. 17(*d*) has a small amount of distortion such as line-end pullback, corner rounding, and the influences of adjacent patterns.

On the other hand, for the case of low-precision processing in which correction specifications are somewhat simplified as compared to the case of high-precision processing, the design layout pattern shown in FIG. 17(*a*) is modified into the post-OPC layout pattern shown in FIG. 17(*c*). The post-OPC layout pattern shown in FIG. 17(*c*) is transferred onto a wafer as shown in FIG. 17(*e*). The post-OPC layout pattern shown in FIG. 17(*c*) is such that, using somewhat simplified correction specifications, corrections allowing for distortion, such as line-end pullback, corner rounding, and the influences of adjacent patterns, in advance are made on the design layout pattern shown in FIG. 17(*a*). Accordingly, the finished pattern on a wafer shown in FIG. 17(*e*), as compared to that in FIG. 17(*d*), has more residual distortion such as a large amount of line-end pullback, a small amount of lateral bulge in the line end, corner rounding, and the influences of adjacent patterns.

FIGS. 18 are top views for explaining differences between high-precision model-based OPC processing, and low-precision model-based OPC processing in which threshold specifications are somewhat reduced (a threshold level is reduced). FIG. 18(*a*) shows a design layout pattern; FIGS. 18(*b*) and 18(*c*) show post-OPC layout patterns resulting from high-precision OPC processing and low-precision OPC processing, respectively; and FIGS. 18(*d*) and 18(*e*) show finished patterns on a wafer resulting from high-precision OPC processing and low-precision OPC processing, respectively.

The design layout pattern shown in FIG. 18(*a*), for the case of high-precision processing, is modified into the post-OPC layout pattern shown in FIG. 18(*b*). The post-OPC layout pattern shown in FIG. 18(*b*) is transferred onto a wafer as shown in FIG. 18(*d*). The post-OPC layout pattern shown in FIG. 18(*b*) is such that corrections allowing for distortion, such as line-end pullback, corner rounding, and the influences of adjacent patterns, in advance are made on the design layout pattern shown in FIG. 18(*a*). Accordingly, the finished pattern on a wafer shown in FIG. 18(*d*) has a small amount of distortion such as line-end pullback, corner rounding, and the influences of adjacent patterns.

On the other hand, for the case of low-precision processing in which threshold specifications are somewhat reduced as compared to the case of high-precision processing, the design layout pattern shown in FIG. 18(*a*) is modified into the post-OPC layout pattern shown in FIG. 18(*c*). The post-OPC layout pattern shown in FIG. 18(*c*) is transferred onto a wafer as shown in FIG. 18(*e*). The post-OPC layout pattern shown in FIG. 18(*c*) is such that, using somewhat reduced threshold specifications, corrections allowing for distortion, such as line-end pullback, corner rounding, and the influences of adjacent patterns, in advance are made on the design layout pattern shown in FIG. 18(a). Accordingly, the finished pattern on a wafer shown in FIG. 18(e), as compared to that in FIG. 18(d), has varying linewidths although it does not have residual distortion such as line-end pullback, corner rounding, and the influences of adjacent patterns. That is, CD (Critical Dimension) accuracy is reduced.

Although model-based OPC has deteriorated CD accuracy due to reduced model accuracy, it can reduce load required for simulations and thus can shorten the time required for OPC processing. The techniques for reducing model accuracy include shortening distances expanded in hierarchical processing (or using no hierarchical expansion if nothing changes within a predetermined distance); reducing a range of consideration during simulation (which is generally represented by a radius of each circle with a simulation point at its center); reducing the number of simulation points; lengthening the intervals between simulation points; and simplifying an expression of a simulation model. FIGS. 19 show, by way of example, that, out of distances expanded in hierarchical processing, only the one in the vicinity of line ends is shortened. FIG. 19(a) shows three types of design layout patterns by way of example. Layout patterns 1a to 3a shall be of the same shape. The line end of the pattern which faces the layout pattern 1a is within a distance d1, while the line ends of the patterns which face the layout patterns 2a and 3a respectively are within a distance d2 that is greater than the distance d1. If the distance d2 be the hierarchically expanded distance, OPC results for the layout patterns 1a to 3a vary depending on the patterns they face and attain high accuracy as shown by layout patterns 1b to 3b in FIG. 19(b). On the other hand, if the distance d1 be the hierarchically expanded distance, the layout pattern 1a is processed in consideration of the pattern it faces, but the layout patterns 2a and 3a are processed only on the assumption that there are no patterns facing them and so that they are in the same conditions. Accordingly, the results are, as shown in FIG. 19(c), that while the layout pattern 1c becomes the same as the layout pattern 1b, the layout patterns 2c and 3c become different from the layout patterns 2b and 3b, respectively, and they become exactly the same shape. Although the layout patterns 2c and 3c are reduced in accuracy, they can be processed as the same layout pattern in one operation. Thus, the processing time can be shortened as compared with the case of FIG. 19(b). This distance may be substituted by pattern linewidths, pattern types (such as edges and line ends), or the linewidths or types of facing patterns, or by classification using DRC.

The aforementioned low-precision processing of more than one kind in model-based OPC may be performed either individually or in combination. Alternatively, through the use of basic DRC functions, switching to low-precision processing may be done for each location on the chip or for each module in the random logic area.

Generally, post-OPC verification is performed after OPC in order to check whether there is no problem in OPC specifications, in OPC processing, or in design layout patterns. In general, switching of model accuracy can be implemented through the use of basic DRC functions. Therefore, not only threshold specifications but also specifications of the post-OPC verification using DRC or simulations can also be reduced in a similar fashion.

As so far described, the semiconductor device and manufacturing method thereof, the mask for semiconductor manufacture, and the optical proximity correction method according to this preferred embodiment are such that, in the random logic area 114 corresponding to a random logic circuit, the area (first area) which requires high-precision processing (first OPC processing) is subjected to high-precision processing, and the area (second area) which does not require high-precision processing is subjected to low-precision processing (second OPC processing). This enables reduction in processing time and manufacturing cost.

As shown in FIG. 1(b), the random logic area 114 is generally larger than the memory area 112 and has more variations in layout. Performing low-precision processing on layout patterns corresponding to dummy gates in an actual random logic circuit reduces the processing time required for OPC by 40%, the amount of memory usage by 60%, and the amount of output data by 80% as compared to performing high-precision processing on every layout pattern.

For photomask formation, 40 percent of the manufacturing cost is due to mask cost associated with mask writing. Thus, the manufacturing cost for transfer onto a wafer using a photomask can be reduced.

While the above description has explained the case of using a photomask for pattern transfer onto a wafer, the present invention is not limited thereto and is also applicable to the case where pattern is directly written onto a wafer. In this case, post-OPC layout patterns are laid out not on a mask but in storage means in a direct imaging device. The present invention is especially effective in a variable shaped direct imaging device in which writing time is proportional to the number of patterns.

Also, while the above description has referred to the case of generating post-OPC layout patterns from design layout patterns, the present invention is not limited thereto and is also applicable to the case of mask writing or direct writing onto a wafer using post-OPC layout patterns. More specifically, because writing requires control of the amount of exposure to a mask or wafer, layout patterns which require high-precision processing may be generated into first layout patterns by controlling the amount of exposure with high accuracy, and layout patterns which require low-precision processing may be generated into second layout patterns by controlling the amount of exposure with low accuracy. This enables further reduction in writing time and manufacturing cost.

<Second Preferred Embodiment>

The first preferred embodiment has described, with reference to FIGS. 12, the technique for extracting dummy layout patterns included in a conductive layer, as an example of layout patterns which allow low-precision processing. A second preferred embodiment describes layout patterns in a conductive layer which are other than the dummy layout patterns but which allow low-precision processing As described above in the first preferred embodiment, since conductive layers acting as transistors overlap with active layers, the whole areas of conductive layers cannot be subjected to low-precision processing as dummy layout patterns. That is, since the areas of conductive layers which overlap with active layers are used as the gates of transistors, those areas and their vicinity require high dimensional accuracy. However, the areas of conductive layers which are spaced away from the areas of overlap with active layers are used not as the gates of transistors but used for connection of transistors, so they require lower dimensional accuracy than the areas used as the gates. Accordingly, even in conductive layers acting as transistors, such areas as described above allow low-precision processing.

FIGS. 20 are top views showing design layout patterns, post-OPC layout patterns, and finished patterns on a wafer for the cases of both high-precision and low-precision processing.

FIG. 20(a) shows a layout pattern of conductive layer which has an L-shaped corner (bend) in the vicinity of active layer (hatched area); and FIG. 20(b) shows a layout pattern of conductive layer which does not have a corner in the vicinity of active layer (but which has a corner away from the active layer). On the active layers, gate electrodes of conductive layers are formed via a gate insulating film. The active layers located on both sides of the gate electrodes serve as source and drain regions, respectively, thus forming a transistor. Specifically, the layout pattern (first transistor) shown in FIG. 20(a) requires high dimensional accuracy and thus needs high-precision processing, but the layout pattern (second transistor) shown in FIG. 20(b) does not require high dimensional accuracy and thus does not need high-precision processing. Accordingly, extracting layout patterns of conductive layers which do not have corners in the vicinity of active layers as shown in FIG. 20(b) (e.g., whose distances from source regions to the corners are greater than a predetermined threshold value), using existing DRC tools, and subjecting them to low-precision processing enable reduction in processing time and manufacturing cost.

The design layout pattern shown in FIG. 20(a), for the case of high-precision processing, is modified into a post-OPC layout pattern shown in FIG. 20(c). The post-OPC layout pattern shown in FIG. 20(c) is transferred onto a wafer as shown in FIG. 20(e). The post-OPC layout pattern shown in FIG. 20(c) is such that corrections allowing for distortion of corner rounding in advance are made on the design layout pattern shown in FIG. 20(a). Accordingly, the finished pattern on a wafer shown in FIG. 20(e) has a small amount of distortion of corner rounding.

On the other hand, the design layout pattern shown in FIG. 20(b), for the case of low-precision processing, is modified into a post-OPC layout pattern shown in FIG. 20(d). The post-OPC layout pattern shown in FIG. 20(d) is transferred onto a wafer as shown in FIG. 20(f). The post-OPC layout pattern shown in FIG. 20(d) is such that no correction allowing for distortion of corner rounding in advance is made on the design layout pattern shown in FIG. 20(b). Accordingly, the finished pattern on a wafer shown in FIG. 20(f), as compared to that in FIG. 20(e), has somewhat residual distortion of corner rounding. More specifically, the inside (and outside) diameters of the corner in FIG. 20(e) are smaller than those in FIG. 20(f) (inside diameter x <inside diameter y). Not only for L-shaped corners but also for T-shaped corners or for any other pattern with pads larger than interconnection lines, their inside and outside diameters increase similarly due to low-precision processing.

According to this preferred embodiment, the layout patterns of conductive layers which have corners in the vicinity of active layers, as shown in FIG. 20(a), are subjected to high-precision processing because they require high dimensional accuracy. On the other hand, the layout patterns of conductive layers which do not have corners in the vicinity of active layers, as shown in FIG. 20(b), are subjected to low-precision processing because they does not require high dimensional accuracy.

In FIG. 20(f), the dotted lines show results for the case where an active layer is formed in the vicinity of the corner. In this case, distortion of corner rounding increases the area (gate size) of overlap between the active layer and the conductive layer, which can be the cause of varied transistor characteristics. Thus, low-precision processing is found inappropriate for that case.

As so far described, the semiconductor device and manufacturing method thereof, the mask for semiconductor manufacture, and the optical proximity correction method according to this preferred embodiment are such that the areas of conductive layers which overlap with active layers, and their vicinity are subjected to high-precision processing, and the areas of conductive layers which are spaced away from the areas of overlap with active layers are subjected to low-precision processing. Accordingly, the second preferred embodiment, like the first preferred embodiment, achieves the effect of reducing processing time and manufacturing cost.

IC devices manufactured in this way have characteristics of high CD accuracy in active layer and its vicinity, and low CD accuracy in areas which are a predetermined distance away from the active layer.

Since CD accuracy depends on the widths of conductive layers, even if processing is performed with the same accuracy, tolerances for conductive layers with large widths are relatively large, but tolerances for conductive layers with small widths are relatively small. Accordingly, even for the case of performing processing with the same accuracy, a plurality of conductive layers of different widths may be subjected to different processing.

<Third Preferred Embodiment>

The first and second preferred embodiments have described, with reference to FIGS. 12 and 20, the areas of conductive layers which allow low-precision processing, as an example of layout patterns which allow low-precision processing. A third preferred embodiment describes the areas of active layer which allow low-precision processing.

The areas of active layers in which contacts are formed are used as transistors and thus sometimes require high dimensional accuracy. On the other hand, the areas of active layers in which no contact is formed are used not as transistors but as dummy layout patterns or other elements, such as resistances, capacitances, and diodes, so they require low dimensional accuracy. Accordingly, such areas can also be subjected to low-precision processing.

FIGS. 21 are top views showing design layout patterns, post-OPC layout patterns, and finished patterns on a wafer for the cases of both high-precision and low-precision processing.

FIG. 21(a) shows a layout pattern of active layer (hatched area) in which a contact (shown with thick lines) is formed; and FIG. 20(b) shows a layout pattern of active layer in which no contact is formed. Specifically, the layout pattern shown in FIG. 21(a) requires high dimensional accuracy and thus needs high-precision processing, but the layout pattern shown in FIG. 21(b) does not require high dimensional accuracy and thus does not need high-precision processing. Accordingly, extracting layout patterns of active layers in which no contact is formed as shown in FIG. 21(b), using existing DRC tools, and subjecting them to low-precision processing enable reduction in processing time and manufacturing cost.

The design layout pattern shown in FIG. 21(a), for the case of high-precision processing, is modified into a post-OPC layout pattern shown in FIG. 21(c). The post-OPC layout pattern shown in FIG. 21(c) is transferred onto a wafer as shown in FIG. 21(e). The post-OPC layout pattern shown in FIG. 21(c) is such that corrections allowing for distortion of corner rounding and edge movement in advance are made on the design layout pattern shown in FIG. 21(a). Accordingly, the finished pattern on a wafer shown in FIG. 21(e) has a small amount of distortion of corner rounding and edge movement.

On the other hand, the design layout pattern shown in FIG. 21(b), for the case of low-precision processing, is modified into a post-OPC layout pattern shown in FIG. 21(d). The post-OPC layout pattern shown in FIG. 21(d) is transferred onto a wafer as shown in FIG. 21(f). The post-OPC layout pattern shown in FIG. 21(d) is such that no correction allowing for distortion of corner rounding in advance is made on the design layout pattern shown in FIG. 21(b). Accordingly, the finished pattern on a wafer shown in FIG. 21(f), as compared to that in FIG. 21(e), has somewhat residual distortion of corner rounding and edge movement.

Since the layout patterns of active layers in which no contact is formed as shown in FIG. 21(b) do not require high dimensional accuracy, such layout patterns can be subjected to low-precision processing. This enables reduction in processing time and manufacturing cost.

IC devices manufactured in this way have characteristics of high CD accuracy in the areas of active layers in which contacts are formed, and low CD accuracy in the areas of active layers in which no contact is formed.

Also, the areas of active layers which overlap with conductive layers require high dimensional accuracy because they are used as the gates of transistors. On the other hand, the areas of active layers which do not overlap with conductive layers require lower dimensional accuracy than the areas used as the gates. Accordingly, such areas can also be subjected to low-precision processing.

FIGS. 22 are top views showing design layout patterns, post-OPC layout patterns, and finished patterns on a wafer for the cases of both high-precision and low-precision processing.

FIG. 22(a) shows a layout pattern of active layer (hatched area) which has a corner formed in the vicinity of conductive layer (in other words, conductive layer is formed in the vicinity of a corner); and FIG. 22(b) shows a layout pattern of active layer which has no conductive layer formed in the vicinity of a corner. Specifically, the layout pattern shown in FIG. 22(a) requires high dimensional accuracy and thus needs high-precision processing, but the layout pattern shown in FIG. 22(b) does not require high dimensional accuracy and thus does not need high-precision processing. Accordingly, extracting layout patterns of active layers which do not overlap with conductive layers in the vicinity of corners as shown in FIG. 22(b), using existing DRC tools, and subjecting them to low-precision processing enable reduction in processing time and manufacturing cost.

The design layout pattern shown in FIG. 22(a), for the case of high-precision processing, is modified into a post-OPC layout pattern shown in FIG. 22(c). The post-OPC layout pattern shown in FIG. 22(c) is transferred onto a wafer as shown in FIG. 22(e). The post-OPC layout pattern shown in FIG. 22(c) is such that corrections allowing for distortion of corner rounding and movement of edges which do not meet conductive layers in advance are made on the design layout pattern shown in FIG. 22(a). Accordingly, the finished pattern on a wafer shown in FIG. 22(e) has a small amount of distortion of corner rounding and movement of edges which do not meet conductive layers.

On the other hand, the design layout pattern shown in FIG. 22(b), for the case of low-precision processing, is modified into a post-OPC layout pattern shown in FIG. 22(d). The post-OPC layout pattern shown in FIG. 22(d) is transferred onto a wafer as shown in FIG. 22(f). The post-OPC layout pattern shown in FIG. 22(d) is such that no correction allowing for distortion of corner rounding and edge movement in advance is made on the design layout pattern shown in FIG. 22(b). Accordingly, the finished pattern on a wafer shown in FIG. 22(f), as compared to that in FIG. 22(e), has somewhat residual distortion of corner rounding and edge movement.

Since the layout patterns of active layers which have no conductive layers formed in the vicinity of corners as shown in FIG. 22(b) do not require high dimensional accuracy, such layout patterns can be subjected to low-precision processing. This enables reduction in processing time and manufacturing cost.

In FIG. 22(f), the dotted lines show results for the case where a conductive layer is formed in the vicinity of the corner. In this case, distortion of corner rounding increases the area (gate size) of overlap between active layer and conductive layer, which can be the cause of varied transistor characteristics. Thus, low-precision processing is found inappropriate for that case.

IC devices manufactured in this way have characteristics of high CD accuracy in the areas of active layers which have conductive layers formed in the vicinity of corners, and low CD accuracy in the areas of active layers which have no conductive layer formed in the vicinity of corners (whose corners are a predetermined distance away from conductive layers).

Further, since required CD accuracy depends on the widths of conductive layers, even for the case of performing processing with the same accuracy, tolerances for conductive layers with large widths are relatively large, but tolerances for conductive layers with small widths are relatively small. Accordingly, even for the case of performing processing with the same accuracy, a plurality of active layers which are formed in the vicinity of a plurality of conductive layers of different widths may be subjected to different processing.

As so far described, the semiconductor device and manufacturing method thereof, the mask for semiconductor manufacture, and the optical proximity correction method according to this preferred embodiment are such that the areas of active layers which are used as the gates of transistors are subjected to high-precision processing, and the areas of active layers which are not used as the gates of transistors are subjected to low-precision processing. Accordingly, the third preferred embodiment, like the first and second preferred embodiments, achieves the effect of reducing processing time and manufacturing cost.

<Fourth Preferred Embodiment>

The third preferred embodiment has described, with reference to FIGS. 21 and 22, the areas of active layers which allow low-precision processing, as an example of the layout patterns which allow low-precision processing. A fourth preferred embodiment describes the areas of interconnection layers (interconnection areas) which allow low-precision processing.

The areas of interconnection layers in which contacts or vias (hereinafter referred to collectively as hole layers (hole areas)) are formed are used as interconnection lines and thus require high dimensional accuracy. On the other hands, the areas of interconnection layers in which no hole layer is formed are not used as interconnection lines and thus require low dimensional accuracy. Accordingly, such areas can also be subjected to low-precision processing.

FIGS. 23 are top views showing design layout patterns, post-OPC layout patterns, and finished patterns on a wafer for the cases of both high-precision and low-precision processing.

FIG. 23(a) shows a layout pattern of interconnection layer in which a hole layer (shown with thick lines) is formed; and FIG. 23(b) shows a layout pattern of interconnection layer in which no hole layer is formed. Specifically, the layout pattern shown in FIG. 23(a) requires high dimensional accuracy and thus need high-precision processing, but the layout pattern shown in FIG. 23(b) does not require high dimensional accuracy and thus does not need high-precision processing. Accordingly, extracting layout patterns of interconnection layers in which no hole layer is formed as shown in FIG.

23(b), using existing DRC tools, and subjecting them to low-precision processing enable reduction in processing time and manufacturing cost.

The design layout pattern shown in FIG. 23(a), for the case of high-precision processing, is modified into a post-OPC layout pattern shown in FIG. 23(c). The post-OPC layout pattern shown in FIG. 23(c) is transferred onto a wafer as shown in FIG. 23(e). The post-OPC layout pattern shown in FIG. 23(c) is such that corrections allowing for distortion of corner rounding, line-end pullback, and edge movement in advance are made on the design layout pattern shown in FIG. 23(a). Accordingly, the finished pattern on a wafer shown in FIG. 23(e) has a small amount of distortion of corner rounding and edge movement.

On the other hand, the design layout pattern shown in FIG. 23(b), for the case of low-precision processing, is modified into a post-OPC layout pattern shown in FIG. 23(d). The post-OPC layout pattern shown in FIG. 23(d) is transferred onto a wafer as shown in FIG. 23(f). The post-OPC layout pattern shown in FIG. 23(d) is such that no correction allowing for distortion of corner rounding and edge movement in advance is made on the design layout pattern shown in FIG. 23(b). Accordingly, the finished pattern on a wafer shown in FIG. 23(f), as compared to that in FIG. 23(e), has somewhat residual distortion of corner rounding and edge movement.

As described, the semiconductor device and manufacturing method thereof, the mask for semiconductor manufacture, and the optical proximity correction method according to this preferred embodiment are such that the areas of interconnection layers which are used as interconnection lines are subjected to high-precision processing, and the areas of interconnection layers which are not used as interconnection lines are subjected to low-precision processing. Accordingly, the fourth preferred embodiment, like the first to third preferred embodiments, achieves the effect of reducing processing time and manufacturing cost.

IC devices manufactured in this way have characteristics of high CD accuracy in the areas of interconnection layers in which hole layers are formed, and low CD accuracy in the areas of interconnection layers in which no hole layer is formed.

Even for the interconnection layers provided with hole layers, those which are always fixed at drain potential Vdd or at collector potential Vcc, or those which are not connected to any other interconnection layer via their hole layers require lower accuracy than the other interconnection layers. Subjecting such interconnection layers to low-precision processing enable further reduction in processing time and manufacturing cost.

Further, since CD accuracy depends on the widths of interconnection layers, even for the case of performing processing with the same accuracy, tolerances for interconnection layers with large widths are relatively large, but tolerances for interconnection layers with small widths are relatively small. Accordingly, even for the case of performing processing with the same accuracy, a plurality of interconnection layers of different widths may be subjected to different processing.

Further, as in the second preferred embodiment, the areas of interconnection layers which overlap with hole layers, and their vicinity may be subjected to high-precision processing, and the areas of interconnection layers which are spaced away from the areas of overlap with hole layers may be subjected to low-precision processing. IC devices manufactured in this way have characteristics of high CD accuracy in the areas of interconnection layers which overlap with hole layers and in their vicinity, and low CD accuracy in the areas of interconnection layers which are spaced away from the areas of overlap with hole layers. Specifically, in the areas of interconnection layers which overlap with hole layers and in their vicinity, the amount of extension of line ends is sufficiently large and thus the line ends are like the tips of matches in shape, while in the areas of interconnection layers which are spaced away from the areas of overlap with hole layers, line ends has a small amount of lateral extension and are somewhat pointed in shape.

<Fifth Preferred Embodiment>

The fourth preferred embodiment has described, with reference to FIGS. 23, the areas of interconnection layers which allow low-precision processing, as an example of the layout patterns which allow low-precision processing. A fifth preferred embodiment describes the areas of hole layers which allow low-precision processing.

The areas of hole layers in which interconnection is formed are connected to the other layers and thus require high dimensional accuracy. On the other hand, the areas of hole layers in which no interconnection layer is formed are not connected to the other layers and thus require low dimensional accuracy. Accordingly, such areas can also be subjected to low-precision processing.

FIGS. 24 are top views showing design layout patterns, post-OPC layout patterns, and finished patterns on a wafer for the cases of both high-precision and low-precision processing.

FIG. 24(a) shows layout patterns of hole layers (shown with thick lines) provided with interconnection layers; and FIG. 24(b) shows layout patterns of hole layers provided with no interconnection layer. Specifically, the layout patterns shown in FIG. 24(a) require high dimensional accuracy and thus need high-precision processing, but the layout patterns shown in FIG. 24(b) do not require high dimensional accuracy and thus do not need high-precision processing. Accordingly, extracting layout patterns of hole layers which are provided with no interconnection layer as shown in FIG. 24(b), using existing DRC tools, and subjecting them to low-precision processing enable reduction in processing time and manufacturing cost.

The design layout patterns shown in FIG. 24(a), for the case of high-precision processing, are modified into post-OPC layout patterns shown in FIG. 24(c). The post-OPC layout patterns shown in FIG. 24(c) are transferred onto a wafer as shown in FIG. 24(e). The post-OPC layout patterns shown in FIG. 24(c) are such that corrections allowing for distortion at edge positions in advance are made on the design layout patterns shown in FIG. 24(a). Accordingly, the finished patterns on a wafer shown in FIG. 24(e) are almost perfectly circular in shape, having a small amount of distortion at edge positions.

On the other hand, the design layout patterns shown in FIG. 24(b), for the case of low-precision processing, are modified into post-OPC layout patterns shown in FIG. 24(d). The post-OPC layout patterns shown in FIG. 24(d) are transferred onto a wafer as shown in FIG. 24(f). The post-OPC layout patterns shown in FIG. 24(d) is such that no correction allowing for distortion at edge positions in advance is made on the design layout patterns shown in FIG. 24(b). Accordingly, the finished patterns on a wafer shown in FIG. 24(f), as compared to those in FIG. 24(e), have somewhat residual distortion at edge positions (which are not perfect circles but are elliptical in shape).

As described, the semiconductor device and manufacturing method thereof, the mask for semiconductor manufacture, and the optical proximity correction method according to this preferred embodiment are such that the areas of hole layers provided with interconnection layers are subjected to high-precision processing, and the areas of hole layers provided with no interconnection layer are subjected to low-precision processing. Accordingly, the fifth preferred embodiment, like the first to fourth preferred embodiments, achieves the effect of reducing processing time and manufacturing cost.

IC devices manufactured in this way have characteristics of high CD accuracy in the areas of hole layers provided with interconnection layers, and low CD accuracy in the areas of hole layers provided with no interconnection layer. Specifically, the hole layers provided with interconnection layers have a small degree of out-of-roundness of the layout pattern shape, while the hole layers provided with no interconnection layer have a great degree of out-of-roundness of the layout pattern shape.

Even for the hole layers provided with interconnection layers, if a plurality of those hole layers are maintained at almost a fixed potential (fixed at almost the same potential) and are located within a predetermined distance, their required accuracy is lower than the accuracy required for the other hole layers provided with interconnection layers. Accordingly, even for the hole layers provided with interconnection layers, if the number of those hole layers which are located within a predetermined distance and which are maintained at almost a fixed potential exceeds predetermined threshold value, those hole layers can also be subjected to low-precision processing. This enables further reduction in processing time and manufacturing cost. Similarly, interconnection layers located in the vicinity of such hole layers also require relatively low accuracy. Thus, if the number of hole layers which are located within a predetermined distance and which are maintained at almost a fixed potential exceeds predetermined threshold value, reducing OPC accuracy for interconnection layers which are located within another predetermined distance from those hole layers enables reduction in processing time and manufacturing cost. For example, the interconnection layer shown in FIG. 25(*a*) has a plurality of hole layers which are maintained at almost a fixed potential, being located within a predetermined distance from adjacent hole layers. Thus, if large distortion such as line-end pullback or corner rounding causes some of the hole layers to deviate, the other hole layers can serve as complements; so low-precision processing is applicable. On the other hand, the interconnection layer shown in FIG. 25(*b*) has a plurality of contact holes each being located more than the predetermined distance away from the others and located independently where contacts are to be made, and thus needs high-precision processing.

Further, since CD accuracy depends on the area of hole layers, even for the case of performing processing with the same accuracy, tolerances for hole layers with large area are relatively large, but tolerances for hole layers with small area are relatively small. Accordingly, even for the case of performing processing with the same accuracy, a plurality of hole layers having different areas may be subjected to different processing.

As so far described, the first to fifth preferred embodiments are characterized in the extraction of layout patterns which allow low-precision processing, by referring to other relevant layers for each layer in layout patterns to be subjected to OPC processing.

<Sixth Preferred Embodiment>

The first to fifth preferred embodiments have described the techniques for reducing processing accuracy using basic DRC functions. A sixth preferred embodiment describes a technique for reducing processing accuracy by merging a plurality of kinds of design layout patterns which are similar to each other in shape, into one kind of post-OPC layout pattern.

FIGS. 26 are top views showing a semiconductor manufacturing method according to this preferred embodiment.

A post-OPC layout shown in FIG. 26(*a*) includes post-OPC patterns 201 to 204. The post-OPC patterns 201 to 204 have portions 211 to 214, respectively, which are formed of patterns corresponding to contact pads. The portions 211, 213 and 214 have the same width, but the portion 212 has a different width from the portions 211, 213 and 214. The post-OPC patterns 201, 203, and 204 are slightly different from each other in the positions of their portions 211, 213, and 214.

Referring to FIG. 26(*a*), since the post-OPC patterns 201, 203, and 204 respectively have the portions 211, 213, and 214 which are provided at slightly different positions but which have the same width, they are considered as having similar shapes and similar simulation results. On the other hand, since the post-OPC pattern 202 has the portion 212 which has a different width from the portions 211, 213 and 214, it is considered as having a different shape and a different simulation result from the post-OPC patterns 201, 203, and 204.

The post-OPC layout shown in FIG. 26(*b*) includes post-OPC patterns 201*a* and 202*a*. Specifically, since the post-OPC patterns 201, 203, and 204 shown in FIG. 26(*a*), after low-precision OPC processing, become similar to each other in shape, they are merged and corrected into one kind of post-OPC pattern 201*a* obtained from the post-OPC pattern 201. On the other hand, since the post-OPC pattern 202 shown in FIG. 26(*a*) has a different shape from the post-OPC patterns 201, 203, and 204, it is corrected into the post-OPC pattern 202*a* which is different from the post-OPC pattern 201*a*. In FIGS. 26, the area of the post-OPC pattern 201 and the like, other than the portion 211 and the like, serve as first portions according to the present invention, and the portion 211 and the like serve as second portions according to the present invention.

Figure 27:
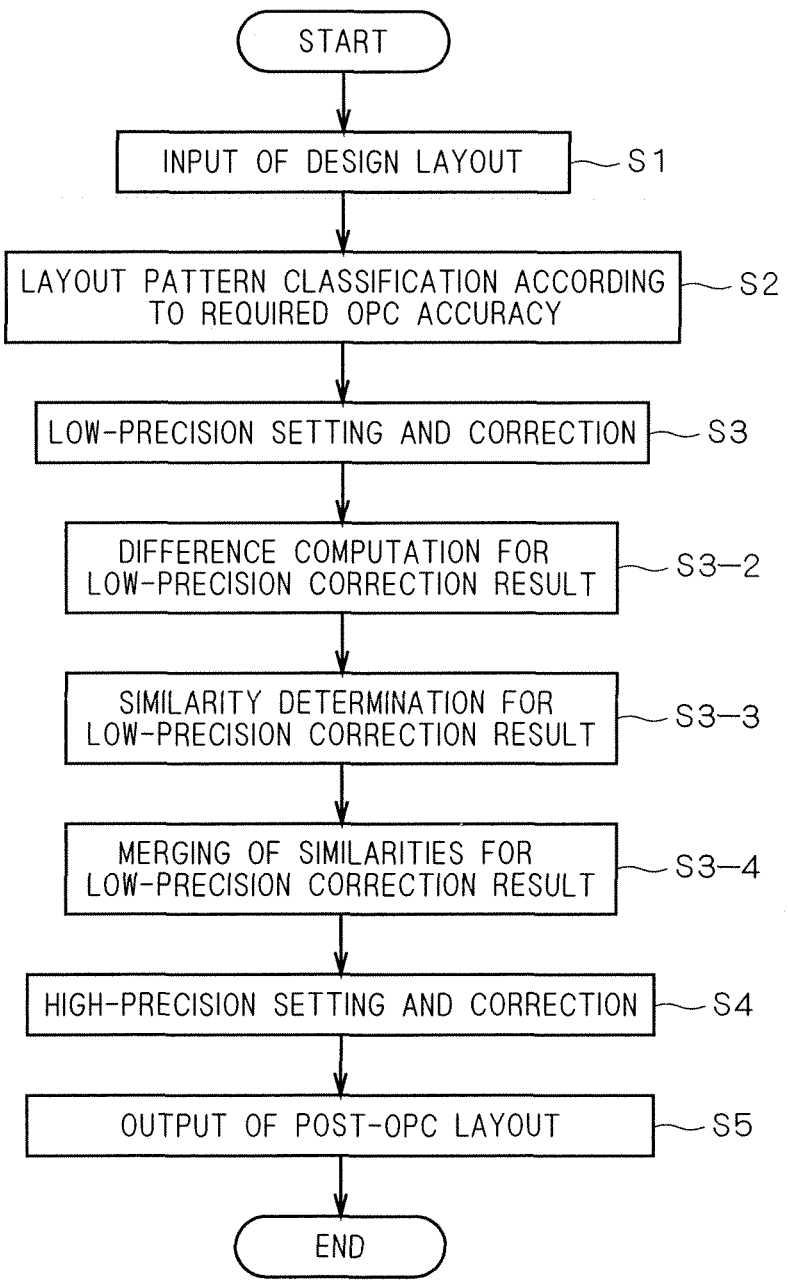
[FIG. 27] a flowchart showing the semiconductor device manufacturing method according to the sixth preferred embodiment.

FIG. 27 is a flowchart showing the OPC processing method according to this preferred embodiment. FIG. 27 is different from the flowchart of FIG. 7 in that steps S3-2 to S3-4 are inserted between steps S3 and S4.

Step S3-2 is to calculate differences for each of a plurality of kinds of low-precision post-OPC patterns obtained through the setting and correction in step S3. These differences are calculated based on layout shapes and simulation results.

The process then goes to step S3-3 where the differences calculated in step S3-2 are compared with predetermined threshold value to determine whether the plurality of kinds of low-precision OPC patterns are similar to each other.

The process then goes to step S3-4 where, based on the results of determination in step S3-3, the plurality of similar kinds of post-OPC patterns are merged into one kind of post-OPC pattern. Thereby, the plurality of similar kinds of post-OPC patterns can be merged into one kind of post-OPC pattern.

While the above description has explained the case where the post-OPC patterns 201, 203, and 204 are merged into the post-OPC pattern 201*a* obtained from the post-OPC pattern 201, the post-OPC patterns 201, 203, and 204 may be merged not only into the post-OPC pattern 201*a* obtained from the post-OPC pattern 201, but also into a post-OPC pattern obtained from the post-OPC pattern 203 or 204. Specifically, we can select any of the plurality of kinds of post-OPC patterns, or we may use a predetermined pattern which has been registered in advance, instead of the pattern obtained from any of the post-OPC patterns 201 to 204. At this time, selecting, for example, such a pattern that has a desirable simulation result (e.g., a width close to the target value, or a large margin), or that is easy to be processed in subsequent steps, or that has a small number of vertices enables reduction in processing time and manufacturing cost.

As described above, the semiconductor device and manufacturing method thereof, the mask for semiconductor manufacture, and the optical proximity correction method according to this preferred embodiment enable reduction in processing accuracy by merging a plurality of kinds of design patterns which are similar to each other in shape, into one kind of post-OPC pattern. Accordingly, in addition to the effect of the first preferred embodiment, there is the effect of reducing processing time and manufacturing cost associated with registration of post-OPC layout patterns through reduction in the number of variations in post-OPC layout pattern. This is especially effective for the case where patterns are merged into such a shape as allowing collective writing during direct writing adopting cell projection.

IC devices manufactured in this way have characteristics of low CD accuracy in a plurality of patterns of the same shape.

While the above description has explained the case of determining similarity by referring to the widths of the portions 211 to 214 of the patterns corresponding to contact pads, not only the widths of the portions 211 to 214 but also the sizes of any other portions may be used.

<Seventh Preferred Embodiment>

The sixth preferred embodiment has explained the technique for reducing processing accuracy by merging a plurality of kinds of design patterns which are similar to each other in shape, into one kind of post-OPC pattern. However, according to the sixth preferred embodiment, since a plurality of kinds of design patterns which are similar to each other in shape are merged after all of them have gone through OPC processing, there are some cases where not much reduction is observed in load associated with OPC processing, even though mask writing time can be shortened. A seventh preferred embodiment describes a technique for reducing processing accuracy while reducing load associated with OPC processing.

FIGS. 28 are top views showing the semiconductor manufacturing method according to this preferred embodiment.

A design layout shown in FIG. 28(a) is such that a design cell 301 is surrounded by design cells 302 to 305. Specifically, the design cell 301 has the design cell 302 located on its top side, the design cell 303 on its bottom side, the design cell 304 on its left side, and the design cell 305 on its right side. The design cells 301 to 305 each include a plurality of design layout patterns, forming a predetermined general-purpose circuit (such as an AND circuit) in a random logic circuit. As shown in FIG. 28(a), these design cells have different widths depending on each cell type, and have the same height irrespective of the cell type.

Generally, a database (library) for management of design layout patterns has registered the cell name (circuit name) of each design cell and the coordinates of four vertices of each design cell. By referring to this library, we can obtain the cell names of the respective design cells 301 to 305 and the relative positions thereof. Hereinbelow, we describe, by way of example, the case where the design cell 301 includes only dummy layout patterns, or such layout patterns that require low accuracy for the boundary around the periphery of the cell.

As shown in FIG. 28(a), if such a design cell 301 that includes only dummy layout patterns or layout patterns which require low accuracy for the boundary around the periphery of the cell is located and surrounded by the design cells 302 to 305 each forming a predetermined circuit, high-precision processing is unnecessary for the whole design cell 301 or for the boundary around the periphery of the cell, depending on the (circuit) types of the design cells 301 to 305. In this case, subjecting the whole or the peripheral portion of the design cell 301 to low-precision processing enables reduction in processing time and manufacturing cost. FIG. 28(b) shows the case where the design cell 301 is replaced by a post-OPC cell 301a, the whole of which or only the peripheral portion of which is subjected to low-precision processing, while the other design cells including the design cells 302 to 305, except their boundaries with the design cell 301, are subjected to high-precision processing and generated into post-OPC cells including post-OPC cells 301a to 305a.

At this time, the post-OPC layout patterns for the design cell 301 may be obtained through graphic operations or simulations based on polygon information in the cell, or post-OPC layout patterns corresponding to layout patterns in the design cell 301 may be prepared in advance and used as-is. Replacing the design cell 301 directly into post-OPC layout patterns prepared in advance eliminates the need to perform graphic operations or simulations based on polygon information in the design cell 301 and thus enables further reduction in processing time and manufacturing cost.

Further, since the design cells 301 to 305 can be of different widths depending on each cell type, for example if the design cell 301 has a large width or the like, there are some cases where other design cells besides the design cells 302 and 303 are located on top and bottom of the design cell 301. In such a case, the cell names and locations of all design cells located on top and bottom of the design cell 301 may be used, or only those of main design cells may be used.

Figure 29:
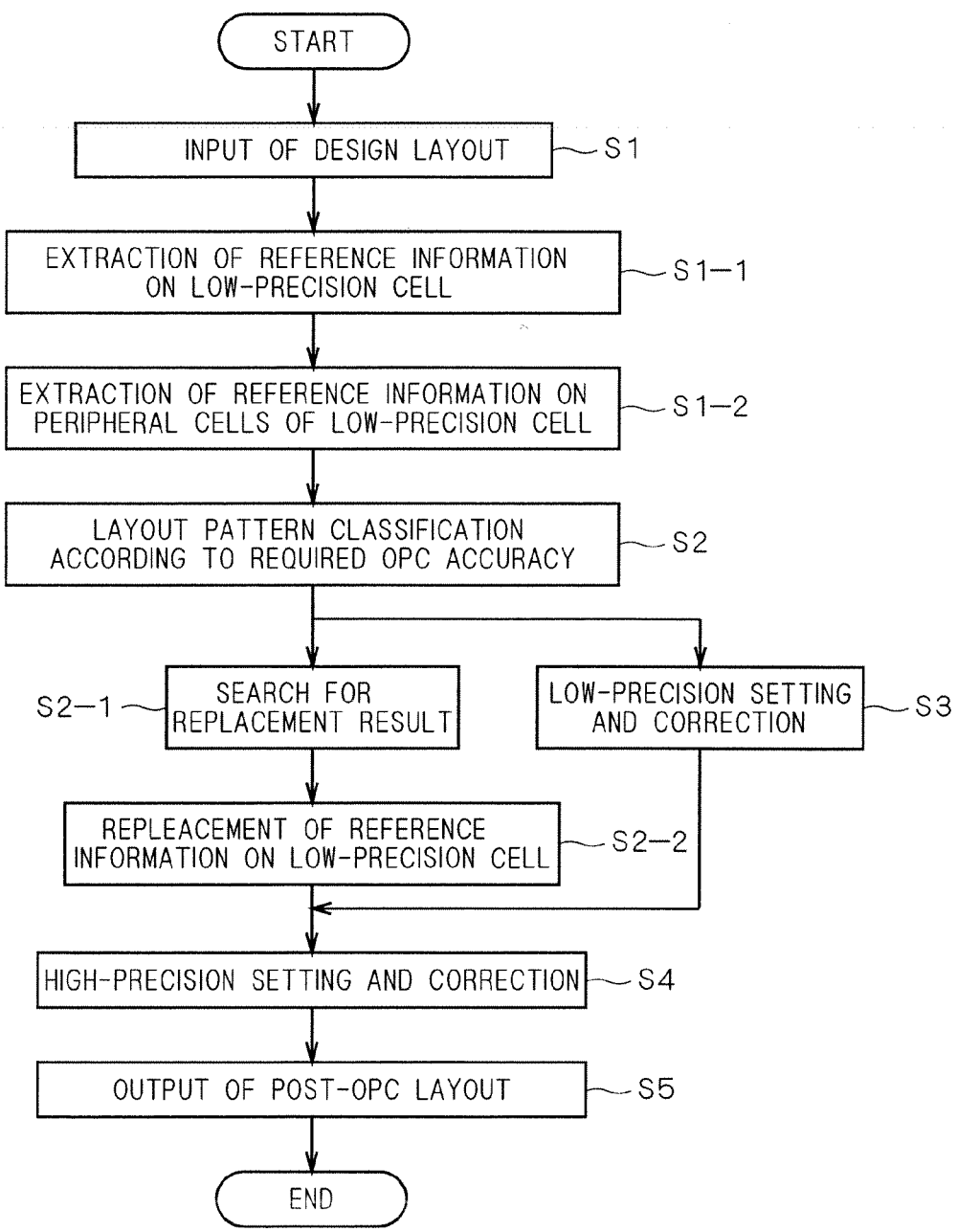
[FIG. 29] a flowchart showing the semiconductor device manufacturing method according to the seventh preferred embodiment.

FIG. 29 is a flowchart showing the OPC processing method according to this preferred embodiment. FIG. 29 is different from the flowchart shown in FIG. 7 in that steps S1-1 and S1-2 are inserted between steps S1 and S2, and that steps S2-1 and S2-2 are inserted in parallel with step S3 between steps S2 and S4.

Step S1-1 is to extract low-precision cell reference information to obtain information on the design cell 301. Step S2-1 is to, using design layout patterns registered in the library in step S1, obtain information (cell names and relative coordinates of vertices with respect to the design cell 301) on the design cell 301 and its peripheral design cells 302 to 305.

The process then goes to step S2 where the design layout patterns entered in step S1 are classified according to accuracy required for OPC. This results in classification into low-precision patterns which require low accuracy and high-precision patterns which require high accuracy. In the present example, in accordance with the information obtained in step S1-1, cell reference information on the design cell 301 surrounded by the design cells 302 to 305 is classified as those to be replaced.

The process then goes to step S2-1 where, using the information obtained in step S1-2, the library is searched for previously registered information (including cell name and polygon information) on the post-OPC cell 301a corresponding to the design cell 301.

The process then goes to step S2-2 where the design cell 301 is replaced by the post-OPC cell 301a obtained in step S2-1. Thus, the post-OPC cell 301a can be obtained from the design cell 301 without performing graphic operations or simulations based on polygon information in the design cell 301.

The processing in steps S2-1 and S2-2 does not interact with the low-precision processing in step S3, but has an influence on the high-precision processing in step S4. Thus, step S3 is performed in parallel with steps S2-1 and S2-2, but step S4 is performed downstream of steps S2-2 and S3.

As described, the semiconductor device and manufacturing method thereof, the mask for semiconductor manufacture, and the optical proximity correction method according to this preferred embodiment are such that the classification of whether each design cell allows low-precision processing is made according to the types of the design cell itself and design cells located around the periphery of that design cell. For the case where low-precision processing is possible, post-OPC layout patterns for the design cell are obtained by replacement into previously registered post-OPC layout patterns. Eliminating the need for graphic operations or simulations, the seventh preferred embodiment achieves, in addition to the effect of the sixth preferred embodiment, the effect of reducing load associated with OPC processing as well as enabling high-speed processing.

While the above description has explained the case where the design cell 301 is classified using all information on the design cells 302 to 305 located on top and bottom and left and right of the design cell 301, the present invention is not limited thereto. For example, if patterns in the boundaries with the cells located on top and bottom of the design cell 301 require relatively low accuracy as compared to patterns in the boundaries with the cells located on the left and right sides, the design cell 301 may be classified using only information on the design cells 304 and 305 which are located on the left and right sides, without considering the cell arrangement along the vertical direction. Or, for example if the cell name (circuit name) of the design cell 301 indicates that the design cell 301 includes only dummy layout patterns, or the like, the design cell 301 may be classified into low-precision patterns according to only its cell name, without using information on its peripheral design cells. Such simplification of the process shortens processing time for classification for example to one fortieth to one hundredth.

For the case where a design cell is located along the edge of a design layout, the design cell does not necessarily have four (or two if only left- and right-side locations are considered) design cells located therearound. Thus, for a design cell which is located along the edge of a design layout, classification may be done by using information on three (or one if only left- and right-side locations are considered) peripheral design cells. And, for a design cell which is located on the corner of a design layout, classification may be done by using information on two (or one if only left- and right-side locations are considered) peripheral design cells. IC devices manufactured in this way have characteristics of low accuracy at least near the boundaries between cells in a design layout.

FIG. 30(a) shows, by way of example, the case where a low-precision area 310 exists on the boundaries between a rectangular design cell 301 (first design cell) and its adjacent rectangular design cells (second design cells) around the periphery of the design cell 301. The low-precision area 310 on the boundaries is a frame-like area having a width corresponding to a distance within which the proximity effect exerts its influence during semiconductor manufacture, or having a width corresponding to the aforementioned distance plus a distance within which the proximity effect exerts its influence during OPC processing. At this time, the design cell 301 has, as shown in FIG. 30(b), a high-precision area (such as the gate interconnection lines 172 in FIG. 13(b)) in its central part and a low-precision area (such as the dummy gate interconnection lines 182 in FIG. 13(b)) on its periphery.

FIG. 31(a) shows, by way of example, the case where the whole design cell 301 and its boundaries with its peripheral design cells form the low-precision area 310. At this time, as shown in FIG. 31(b), the whole of the design cell 301 becomes a low-precision area (such as the dummy gate interconnection lines 182 in FIG. 13(b)).

Figure 32:
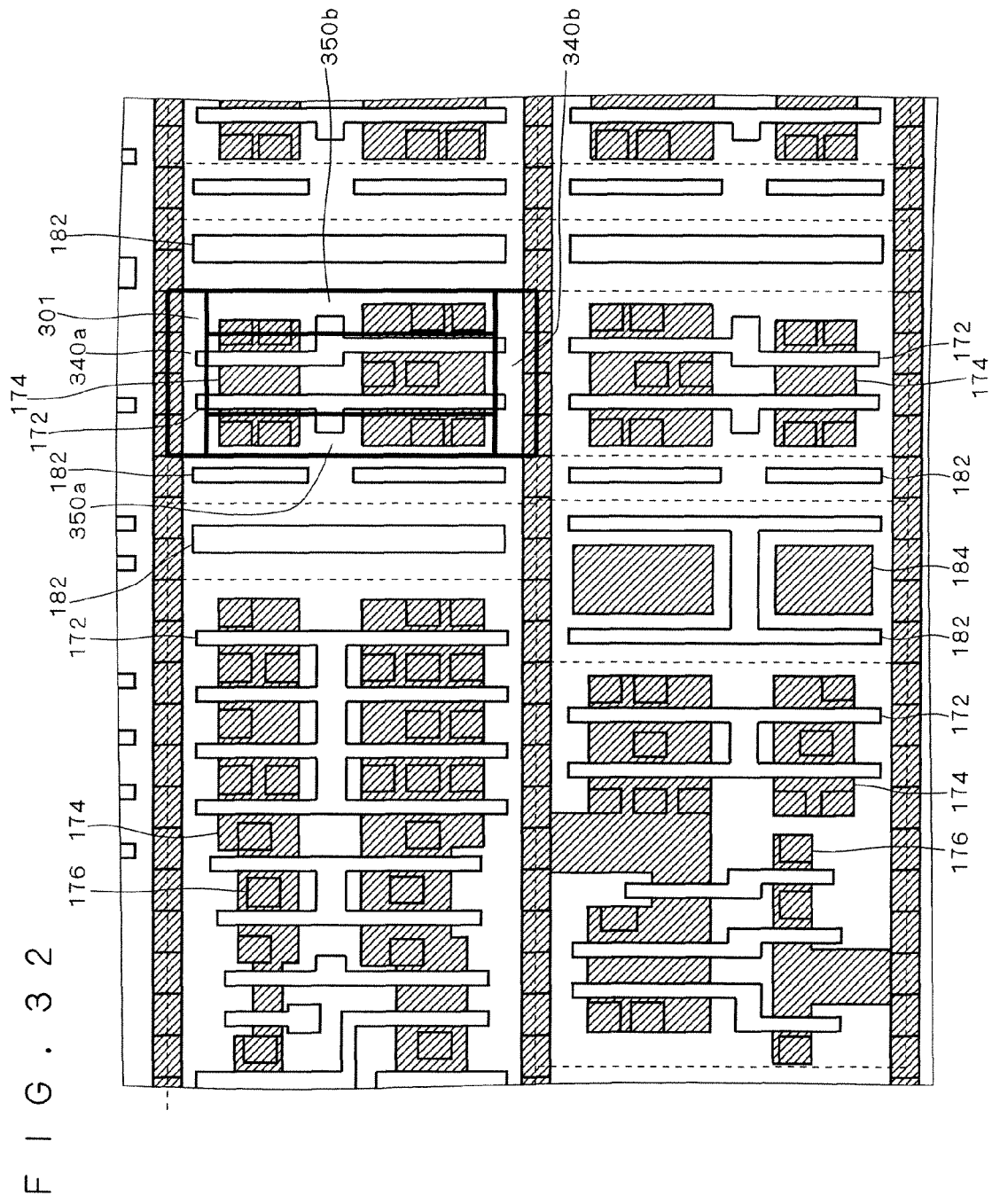
[FIG. 32] top view showing the semiconductor device manufacturing method according to the seventh preferred embodiment.

Further, FIG. 32 shows, by way of example, the case where the design cell 301 is classified using information on its left- and right-side cells as described above (but this figure does not show individual shapes concerned with corrections). As shown in FIG. 32, the gate interconnection lines 172 formed across the active areas 174 and the contacts 176 formed to provide electrical connection with the active areas 174 are laid out in the design cell 301. A top edge portion 340a and a bottom edge portion 340b of the design cell 301 include line ends (of the gate interconnection lines 172) which require relatively low accuracy. Accordingly, the low-precision area on the boundaries surrounding the design cell 301 has characteristic that its top edge portion 340a and its bottom edge portion 340b (a pair of first boundary portions opposed to each other) require lower accuracy than its left edge portion 350a and its right edge portion 350b (a pair of second boundary portions opposed to each other) excluding the top edge portion 340a and the bottom edge portion 340b.

If the design cell 301 is replaced with the same OPC result on the basis of information on left- and right-side cells and irrespective of information on top- and bottom-side cells, as above described, accuracy at the line ends is reduced but accuracy in the areas of the design cell 301 which are not included in the top edge portion 340a and the bottom edge portion 340b will not deteriorate.

Now, we describe the case of previously producing OPC results with which cells are replaced. If OPC results are produced using only cell information on those cells which are located on the left and right sides of cells to be replaced, there are some cases where accuracy in the top edge portion 340a and in the bottom edge portion 340b excessively deteriorate, resulting in an abnormal shape, because of not using cell information on those cells which are located on the top and bottom sides thereof. Thus, previously determined dummy patterns are provided on top and bottom of a cell to be replaced, which prevents excessive deterioration of accuracy in the top edge portion 340a and in the bottom edge portion 340b by virtue of the dummy patterns.

While, in this example, the design cell 301 includes active and conductive layers, the low-precision area of each layer may differ from each other. The point that the low-precision area of each layer may differ from each other is also applicable to the other preferred embodiments While the above description has explained the case where each design cell has a different width depending on each cell type and has the same height irrespective of the cell type, the present invention is not limited thereto, and for example, each design cell may have the same width and the same height irrespective of the cell type. By unifying the height and width of each design cell in this way, a design cell which is located along the edge of a design layout has three design cells (two for a design cell in the corner) located therearound, while a design cell which is located not along the edge of a design layout always has four design cells located therearound. This reduces variations in the relative positions of each design cell, thereby achieving the effect of simplifying processing and shortening processing time. IC devices manufactured in this way have characteristic that design cells are arranged in a square lattice pattern.

While the invention has been shown and described in detail, the foregoing description is in all aspects illustrative and not restrictive. It is therefore understood that numerous modifications and variations can be devised without departing from the scope of the invention.

The invention claimed is:

1. A semiconductor device including a logic circuit, wherein
an area for forming said logic circuit includes:
a first area which is subjected to optical proximity correction with predetermined accuracy; and
a second area which is subjected to optical proximity correction with accuracy lower than said predetermined accuracy, wherein
said first area includes a gate interconnection line,
said second area includes a dummy layout pattern, and
said first area and said second area each include a gate interconnection line of a transistor and an active area which overlaps with said gate interconnection line,
a distance between a corner of said gate interconnection line and said active area in said second area is greater than that in said first area, and
rounding of said corner of said gate interconnection line in said second area is greater than that in said first area.

2. The semiconductor device according to claim 1, wherein
said gate interconnection line in said first area is a conductive layer which overlaps with an active area, and
said dummy layout pattern in said second area is a conductive layer which does not overlap with said active area.

3. The semiconductor device according to claim 1, wherein
said gate interconnection line in said first area is a conductive layer which has a pad pattern corresponding to a contact pad, and
said dummy layout pattern in said second area is a conductive layer which does not have a pad pattern corresponding to a contact pad.

4. The semiconductor device according to claim 1, wherein
said gate interconnection line in said first area is a conductive layer which has at its end a first widened portion that is greater in width than said gate interconnection line itself, and
said dummy layout pattern in said second area is a conductive layer which does not have at its end a second widened portion that is greater in width than said dummy layout pattern itself.

5. The semiconductor device according to claim 1, wherein
said gate interconnection line in said first area is a conductive layer which has a pad pattern corresponding to a contact pad and which has a pattern corresponding to a contact on said pad pattern, and
said dummy layout pattern in said second area is a conductive layer which has a pad pattern corresponding to a contact pad but which does not have a pattern corresponding to a contact on said pad pattern.

6. The semiconductor device according to claim 1, wherein
said gate interconnection line in said first area is a conductive layer which has at its end a first widened portion that is greater in width than said gate interconnection line itself and which has a pattern corresponding to a contact on said first widened portion, and
said dummy layout pattern in said second area is a conductive layer which has at its end a second widened portion that is greater in width than said dummy layout pattern itself but which does not have a pattern corresponding to a contact on said second widened portion.

7. The semiconductor device according to claim 1, wherein
an active area in said first area has a pattern corresponding to a contact, and
an active area in said second area does not have a pattern corresponding to a contact.

8. The semiconductor device according to claim 1, wherein
rounding of said corner of said active area in said second area is greater than that in said first area.

9. The semiconductor device according to claim 1, wherein
an interconnection layer in said first area overlaps with a hole layer, and
an interconnection layer in said second area does not overlap with a hole layer.

10. The semiconductor device according to claim 1, wherein
said first area includes an interconnection layer and a hole layer which overlaps with said interconnection layer, and
said second area is an interconnection layer which is spaced a predetermined distance away from said hole layer.

11. The semiconductor device according to claim 1, wherein
said first area and said second area each include an interconnection layer and a hole layer which overlaps with said interconnection layer,
the potential of the interconnection layer in said first area is not fixed, and
the potential of the interconnection layer in said second area is fixed at a constant value.

12. The semiconductor device according to claim 1, wherein
said first area and said second area each include an interconnection layer of the same potential and a hole layer which overlaps with said interconnection layer,
the number of hole layers in the interconnection layer in said second area is greater than the number of hole layers in said first area.

13. The semiconductor device according to claim 1, wherein
a hole layer in said first area overlaps with an interconnection layer, and
a hole layer in said second area does not overlap with said interconnection layer.

14. The semiconductor device according to claim 1, wherein
said first area and said second area each include an interconnection layer and a hole layer which overlaps with said interconnection layer,
the potential of the hole layer in said first area is not fixed, and
the potential of the hole layer in said second area is fixed at a constant value.

15. The semiconductor device according to claim 1, wherein
said first area and said second area each include an interconnection layer of the same potential and a hole layer which overlaps with said interconnection layer,
the number of hole layers in said second area is greater than that in said first area.

16. The semiconductor device according to claim 1, wherein
said first area includes a plurality of patterns each having a first portion of the same shape and a second portion of a different shape from each other, and
said second area includes a plurality of patterns each having a portion of the same shape as said first portion, and another portion of the same shape which corresponds to said second portion.

17. The semiconductor device according to claim 1, wherein said second area has cells arranged in a square lattice pattern.

18. The semiconductor device according to claim 1, wherein the area for forming said logic circuit includes a first design cell and a plurality of second design cells which are adjacent to said first design cell, and said second area includes a boundary portion between said first design cell and said plurality of second design cells.

19. The semiconductor device according to claim 18, wherein said first design cell and said second design cells are rectangular in shape, said boundary portion surrounds said first design cell, for said first design cell, one pair of first boundary portions opposed to each other require lower accuracy than the other pair of second boundary portions opposed to each other.

20. A semiconductor device comprising:

a semiconductor substrate;

a logic circuit area where a logic circuit is formed on said semiconductor substrate; and first and second transistors each having a gate electrode formed on said semiconductor substrate via a gate insulating film; and source and drain regions formed at both ends of said gate electrode on the surface of said semiconductor substrate, thereby forming said logic circuit, and wherein a gate interconnection line connected to the gate electrodes of said first and second transistors has an L-shaped bend, and the inside diameter of the bend of the gate interconnection line of said first transistor is smaller than that of the bend of the gate interconnection line of said second transistor, and a distance between the bend of the gate interconnection line of said first transistor and said source/drain region is smaller than that between the bend of the gate interconnection line of said second transistor and said source/drain region.

21. The semiconductor device according to claim 20, wherein the outside diameter of the bend of the gate interconnection line of said first transistor is smaller than that of the bend of the gate interconnection line of said second transistor.

22. A semiconductor device comprising:

a semiconductor substrate;

a logic circuit area where a logic circuit is formed on said semiconductor substrate;

a first transistor in said logic circuit area, said first transistor having a plurality of gate interconnection lines formed with first pitches on an active area via a gate insulating film, and a contact electrically connected to said active area between said gate interconnection lines, thereby forming said logic circuit; and a plurality of dummy gate interconnection lines in said logic circuit area, said dummy gate interconnection lines being formed with second pitches on a dummy active area via an insulating film, wherein said gate interconnection lines and said dummy gate interconnection lines each have an end and an L-shaped bend; the inside diameters of said bends of said gate interconnection lines are smaller than those of said bends of said dummy gate interconnection lines; and bulges in said ends of said gate interconnection lines are larger than those in said ends of said dummy gate interconnection lines.

23. The semiconductor device according to claim 22, wherein said first pitches and said second pitches are approximately equal to each other.

\* \* \* \* \*